United States Patent
Williams et al.

(10) Patent No.: US 9,855,752 B2
(45) Date of Patent: *Jan. 2, 2018

(54) MULTI PRINTHEAD REFRACTIVE GRADIENT INKJET PRINTING

(71) Applicant: Vadient Optics, LLC., Beaverton, OR (US)

(72) Inventors: George Williams, Portland, OR (US); John Paul Harmon, Albany, OR (US); Charles G. Dupuy, Corvallis, OR (US); Ngoc Thanh Nguyen, Salem, OR (US); Sang-ki Park, Corvallis, OR (US); Bradley J. Hermens, Corvallis, OR (US)

(73) Assignee: Vadient Optics, LLC, Beaverton, OR (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/382,225

(22) Filed: Dec. 16, 2016

(65) Prior Publication Data
US 2017/0173957 A1      Jun. 22, 2017

Related U.S. Application Data

(63) Continuation-in-part of application No. 14/973,340, filed on Dec. 17, 2015, now Pat. No. 9,555,623.

(51) Int. Cl.
*B41J 2/16* (2006.01)
*C23C 16/56* (2006.01)

(52) U.S. Cl.
CPC ............. *B41J 2/164* (2013.01); *B41J 2/1607* (2013.01); *C23C 16/56* (2013.01)

(58) Field of Classification Search
CPC ...... B41J 2/04535; B41J 2/04586; B41J 2/21; B41J 29/38; B41J 2/164; B41J 2/1607; B41J 2/2132; B41J 2/2107; C23C 16/56; G06K 15/107; B41M 5/0047; B41M 5/502; H01M 4/8832
See application file for complete search history.

(56) References Cited

U.S. PATENT DOCUMENTS

2012/0037025 A1 *   2/2012   Patel .................. B32B 27/08
                                              101/483

* cited by examiner

*Primary Examiner* — Thinh H Nguyen

(57) ABSTRACT

Methods of manufacturing a volumetric continuous gradient complex dielectric element with drop-on-demand techniques, such as inkjet printing, by calculating spatial placement of nanocomposite-ink droplets are disclosed. The methods comprise determining or having a multi-dimensional gradient profile representing a volumetric gradient complex dielectric element. Providing or having a plurality of nanocomposite-inks, at least one of the nanocomposite-inks having a curable organic-matrix and a concentration of nanoparticles dispersed within to print the volumetric continuous gradient complex dielectric device. A print mask is determined in one-, two-, or three-dimensions that reconstructs the multi-dimensional gradient profile as a discretized pattern based on the material properties of the plurality of nanocomposite-inks and properties of a printing apparatus with a plurality of printheads. A spatial or spatiotemporal print schedule is determined that results in an at least approximate reproduction of the gradient profile when printed with the printing apparatus.

24 Claims, 17 Drawing Sheets

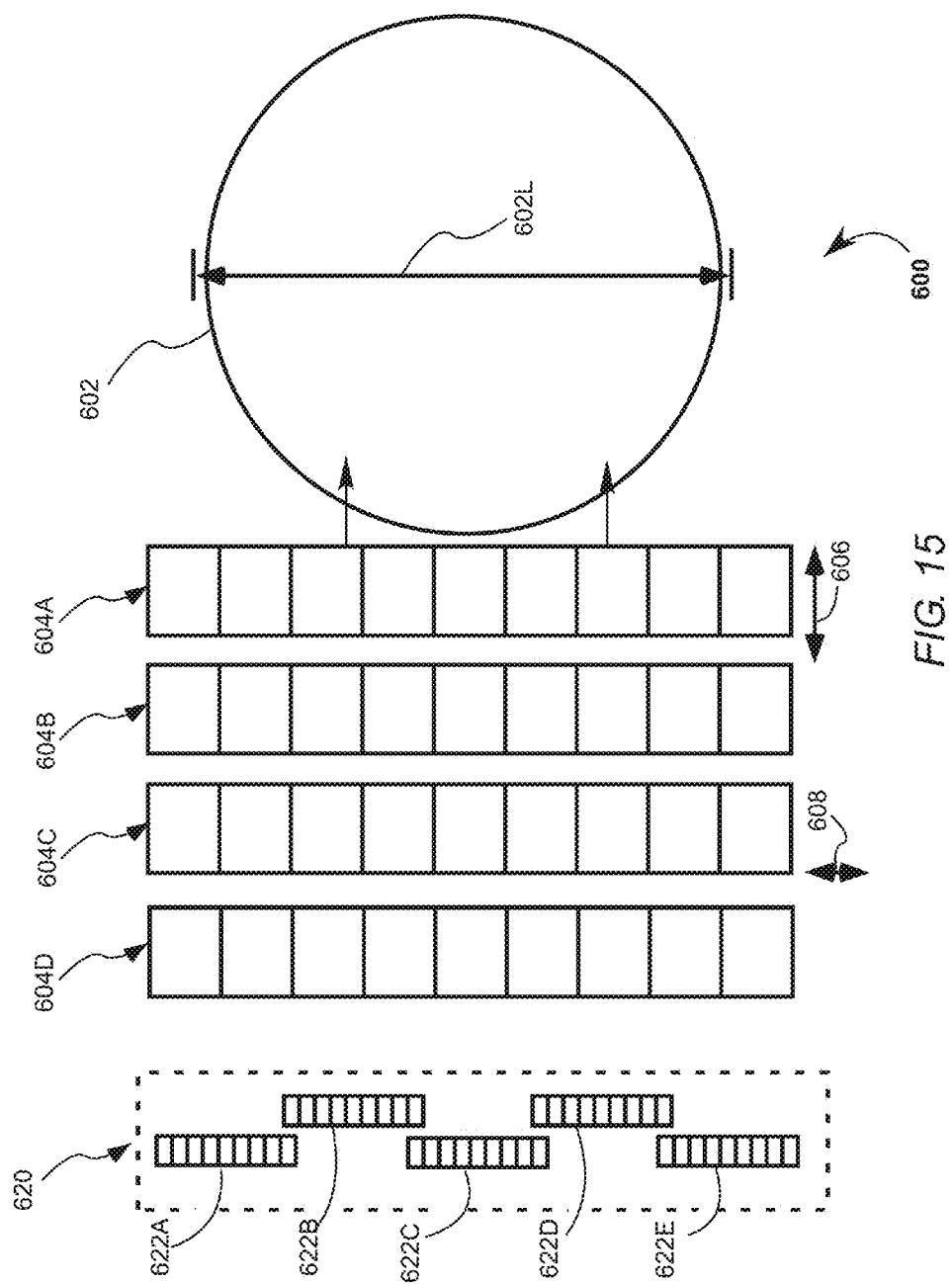

MULTI PRINTHEAD REFRACTIVE GRADIENT INKJET PRINTING

RELATED APPLICATIONS

The patent is a continuation-in-part of U.S. patent Ser. No. 14/973,340 filed on Dec. 17, 2015.

TECHNICAL FIELD OF THE DISCLOSURE

The present disclosure relates in general to drop-on-demand inkjet printing. This application relates in particular to methods of precise and efficient control of material placement and control of droplet mixing and diffusion to create high fidelity gradient refractive index (GRIN) and complex dielectric index profiles.

DISCUSSION OF BACKGROUND ART

A class of freeform gradient index (GRIN) optics rely on axial, radial, or three-dimensionally varying concentrations of one or more organic or inorganic materials which result in nonhomogeneous complex dielectric properties throughout the material. For instance, the refractive-index can be varied so light refracts not only at the air-optic interface, but also refract within the nonhomogeneous 3D gradient index optical material. Advances in material and manufacturing technologies have allowed for drop-on-demand manufacture of such GRIN optics with nanocomposite-inks. One example of which includes traditional inkjet printing.

Traditional inkjet printing applications include printing one or more colored inks on paper or other substrates to reproduce imagery by reflectance or light scattering from the deposited ink and substrate in order to reproduce imagery. In order to produce continuous tones or colors, a multitude of colored inks would be required. Instead, a limited amount of ink colors, in combination with the substrate color, are used to simulate greyscale and color tones using techniques such as halftoning and dithering.

The classical halftoning technique, usually synonymous with amplitude modulation halftoning, uses dots of varying size or spacing to represent intensities. In either case, the dots of various size and/or spacing are generally below the resolving power of the human eye in order to replicate an illusion of a continuous tone image with limited inks. For instance, a continuous transition from white to black can be replicated by gradually increasing black ink dot size, decreasing dot spacing, or both on a white substrate. From a sufficient distance away, the human vision system interpret the dots as a smooth transition.

Dithering, a technique also known as color quantization, is a more general term that refers to randomization or perturbation of colors values, positions, or intensity in order to simulate more tones than are truly available. Generally, dithering is the process of using two colors to simulate the shade of a third color by placing dots of two colors close together on a substrate, the substrate typically white. The dithering process can use several strategies of placing the dots over the region showing the third color. In a dithered image, colors that are not available in the palette are approximated by a depositing grouping of colored droplets. The droplets are typically spatially discrete or slightly overlapping, with areas of the substrate exposed. The human vision system perceives the droplet groupings as a diffusion of the colored droplets and substrate.

Dithering and halftoning rely on the psychophysics of the human eye and neural processing system into perceiving more colors than are there. The human eye perceives the droplets as a mixture of the colors within. The more dither patterns that a device or program supports, the more color tones or shades of gray it can represent.

Every printer has a native internal pixel resolution that printed images will be resampled to. Many commercial printers have a capability to print drops at up to 4800 dpi (dots per inch), although the visible optical resolution is between 600 and 720 ppi (pixels per inch). The tonal range that may be reproducible by a printer is ultimately determined by the cell size of a pixel.

Unlike for printed materials visible to the human eye, there has yet to be well established methods of printing optical inks to achieve a gradient optical index with using two or more specific optical index inks fewer in number than that required by the gradient. Traditional inkjet printing applications include color printing on paper or other substrates. In inkjet printing, imagery is simulated by techniques such as halftoning and dithering. The halftoning technique deposits droplets in dots, or pixels, of various size and/or spacing in order to replicate a continuous tone image, for instance, a continuous transition from white to black can be replicated by gradually increasing dot size, decreasing dot spacing, or both. From a sufficient distance away, the human vision system interpret the dots as a smooth transition. In printing optical materials, wherein sub-wavelength features are important to achieve high modulation transfer functions (MTF), the halftoning methods developed to satisfy the human eye may not be optimal.

SUMMARY OF THE DISCLOSURE

The present disclosure is directed to apparatus and methods of inkjet printing nanocomposite complex dielectric elements, including 3D freeform gradient index optics. In one aspect a method of manufacturing a volumetric gradient complex dielectric element with drop-on-demand techniques, such as inkjet printing, by calculating spatial placement of nanocomposite-ink droplets is disclosed. The method comprises determining or having a multi-dimensional gradient profile representing a volumetric gradient complex dielectric element. Providing or having a plurality of nanocomposite-inks, at least one of the nanocomposite-inks having a curable organic-matrix and a concentration of nanoparticles dispersed within to print the volumetric continuous gradient complex dielectric device. A print mask is determined in one-, two-, or three-dimensions that reconstructs the multi-dimensional gradient profile as a discretized pattern based on the material properties of the plurality of nanocomposite-inks and properties of a printing apparatus with a plurality of printheads. A spatial or spatio-temporal print schedule is determined that results in an at least approximate reproduction of the gradient profile when printed with the printing apparatus.

BRIEF DESCRIPTION OF THE DRAWINGS

The accompanying drawings, which are incorporated in and constitute a part of the specification, schematically illustrate preferred embodiments of the present disclosure, and together with the general description given above and the detailed description of preferred methods and embodiment given below, serve to explain principles of the present disclosure.

FIG. 15 is a plan view of a printing apparatus with a plurality of printheads that laterally spans the volumetric gradient complex dielectric device.

DETAILED DESCRIPTION

Figure 1:
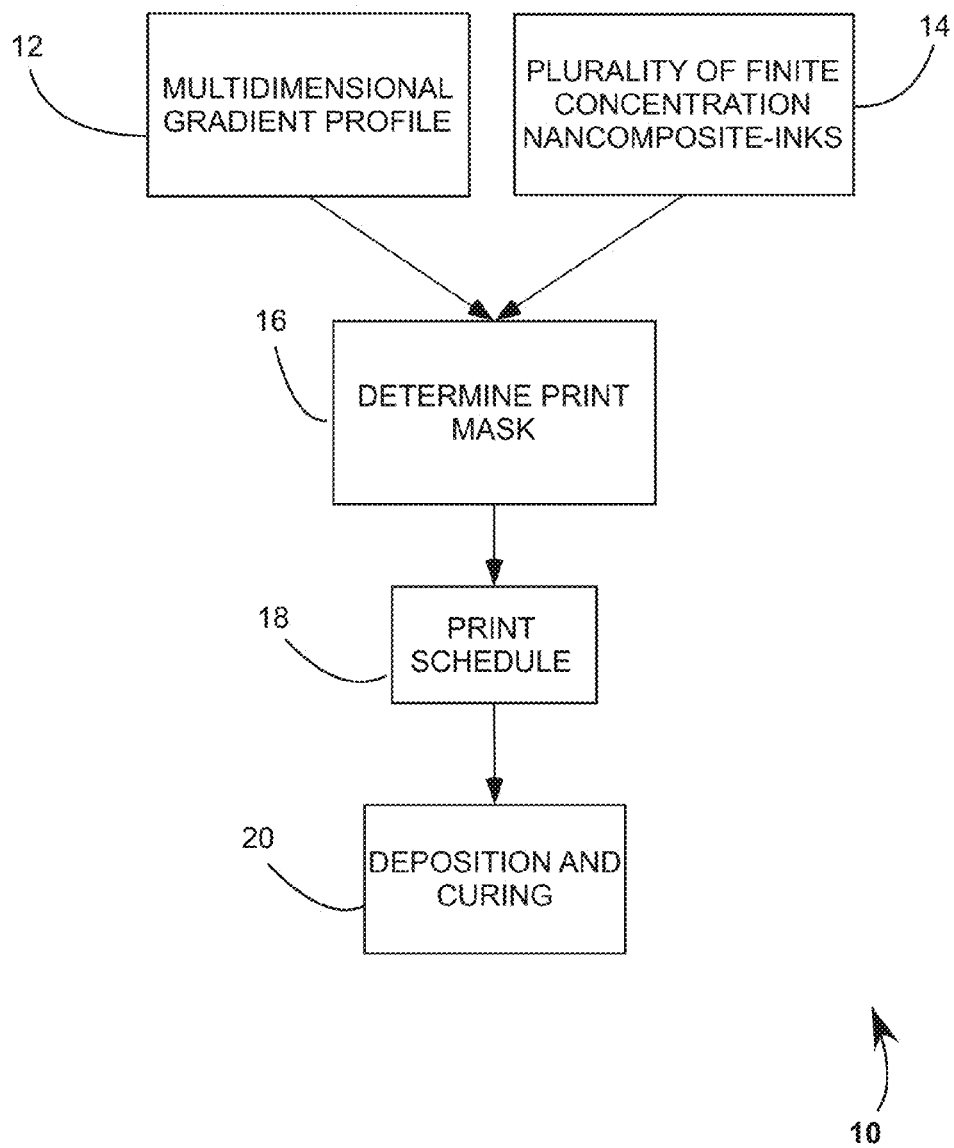
FIG. 1 is a flow diagram illustrating a method of manufacturing a volumetric gradient complex dielectric device.

Unlike printed imagery, which rely on reflection and absorption of light to generate images, optics rely on transmission and refraction to alter the wavefront of light as it passes through a medium. The challenge in manufacturing such devices using ink jet or solution deposition techniques is that the drop sizes, often 5 pL, or larger, create drops that are 10 microns or larger in diameter (2400 drops per inch, or DPI), more than 10× larger than the wavelength or light, whereby to avoid light scattering it is desirable that any inhomogeneity be much smaller than the wavelength of the light. Assuming structure ⅕th the length of 500 nm light (100 nm) can be accommodated, requiring 25,000 ppi, with a practical requirement of about 175,000 ppi. This requirement poses a challenge for fabricating inkjet printed optics with refractive gradients.

Referring to the drawings, wherein like components are designated by like reference numerals. Methods of manufacture and various embodiments of the present disclosure are described further hereinbelow.

Referring to FIG. 1, a flow chart 10 provides a method of manufacturing a volumetric continuous gradient complex dielectric device with drop-on-demand techniques by calculating spatial placement of nanocomposite-ink droplets.

The method includes determining or having volumetric complex dielectric gradient profile 12 representing a volumetric gradient complex dielectric gradient element. Providing or having a plurality of nanocomposite-inks 14 with at least one type of a nanoparticle dispersed within a curable organic-matrix resulting in a finite concentration. The volumetric complex dielectric gradient profile and the plurality of nanocomposite-inks are used in part to provide the multidimensional volumetric nanoparticle concentration gradient 12. The multidimensional volumetric nanoparticle concentration gradient provides the physical properties required at any particular voxel, or 3-dimensional coordinate, within the complex dielectric element. A print mask 16 having one-, two-, or three-dimensions is determined to reconstruct the multi-dimensional gradient profile as a discretized pattern based on the material properties of the plurality of nanocomposite-inks and properties of a printing apparatus. Next a spatial or spatio-temporal print schedule is determined based in at least in part on the discretized pattern resulting in an at least approximate reproduction of the gradient profile when printed with the printing apparatus. The print schedule can include a cure schedule. The cure schedule can be based on a scheduled temporal cycle, a predetermined temporally correlated cure schedule or a dynamic cure schedule. In determining the print mask effects from spatio-temporal nanoparticle diffusion of the plurality of nanocomposite-inks, the material properties of the nanocomposite-inks, properties of the printing apparatus, and material properties of a substrate are considered. Optionally, a last step 20, includes depositing and curing the nanocomposite-ink according to the print schedule.

The volumetric complex dielectric gradient profile may be representative design of an optic, optical system, or optical subsystem incorporating refractive, reflective, absorptive properties, and combinations thereof. Virtually any complex dielectric device, including refractive optics can be manufactured, or designs altered, to be manufactured using volumetric complex dielectric gradients. Nonlimiting examples include lenses, mirrors, phase plates, phase correction plates, polarizers, X2 and X3 electro-optic devices, waveguides, as well as optical system and subsystems which incorporate mechanical and electrical components and combinations thereof.

One simple example of the volumetric dielectric gradient profile is a wood lens. The wood lens typically has a cross-section characterized by a parabolic refractive gradient profile, the wood lens is often cylindrical with planar front and back surfaces. Deposition of such an optic using nanocomposite-ink has fundamentally different requirements than traditional printing. Unlike traditional inkjet printing, the optic must be volumetrically filled with no voids, unless intentionally incorporated. Since a finite number of the nanocomposite-inks are available for any particular application, diffusion of nanoparticles must be incorporated and implemented in a controlled manner. Unlike traditional inkjet printing, diffusion is physical, not a phenomena of the human visual system (HVS), and the deposition schedule must accommodate spatial and temporal variation and resultant errors due to diffusion.

The multi-dimensional gradient profile can be determined exclusively on the volumetric gradient complex dielectric profile or account for practical limitations, When the multidimensional gradient profile based exclusively on the volumetric gradient complex dielectric profile can be termed an ideal multi-dimensional gradient profile. Practical limitations that can be used to determine the multidimensional gradient profile include the properties of the plurality of nanocomposite-inks, the properties of the printing apparatus, the spatio-temporal properties of the print pattern, the inter-diffusion between nanocomposite-ink droplets, a temporally correlated radiative curing cycle, or combinations thereof. To determine the multidimensional gradient profile when representing an optical element, optical design software tools such as OSLO, ZEMAZ, and Code V can be used.

The print mask and deposition schedule are determined based in part on spatio-temporal nanoparticle diffusion and the material properties of the nanocomposite-inks, properties of the printing apparatus and materials properties of the substrate. Each of the aforementioned dependencies are interrelated and understanding of each is required to determine the print schedule. The deposition schedule comprises interrelated components, the print mask, print path, deposition schedule and curing schedule. The print mask composition includes the shape, area or volume, and quantization values. The print mask can be static and applied the entire multidimensional gradient profile, apply to individual areas within, or adaptively change according to local parameters. The print mask composition can be determined based on the multidimensional gradients profile's local frequency content, global frequency content, gradient magnitude, gradient magnitude contrast, physical diffusion lengths, time duration between printing adjacent droplets, or combinations thereof.

The print mask provides the type of nanocomposite-ink droplet deposited within each volumetric area as a discretized pattern.

The print mask can incorporate and use dither patterns, including halftone, crosshatching patterns, introduction of noise components, and complex spatially aware techniques. The print mask can be defined in terms of a print tile wherein the print tile are volumetric locations at least as large as the nanocomposite-ink droplet volumes. The print mask can be applied according to the print path or another path not correlated with the print path. The print path determines in part order in which the nanocomposite-ink droplets are deposited. The print schedule, in conjunction with the discretized pattern computed in part from the print mask, provides the deposition and curing prioritization of the deposited nanocomposite-inks and whether the cure is partial, a full cure and spatial extend of the cure.

The nanocomposite-ink is characterized by the nanoparticle and the organic-matrix properties. The nanoparticles can vary by material, size, shape, and concentration within the organic-matrix. A plurality of nanoparticles types can be dispersed within the nanocomposite-ink. The nanoparticles can be any material or nanostructure sufficiently small, compared to those wavelength of intended use, not to scatter light. The nanoparticles with the nanocomposite-ink can comprise of one or more metal, dielectric, semiconductor, or organic materials such as electro-optic polymers. Nonlimiting examples include beryllium (BeO), aluminum nitride (AlO), silicon carbide (SiC), zinc oxide (ZnO), zirconium oxide (ZrO), yttrium orthovanadate (YVO4), titanium oxide ($TiO_2$), copper sulfide ($CuS_2$), cadmium selenide (CdSe), lead sulfide (PbS), molybdenum disulfide ($MoS_2$), silicon dioxide ($SiO_2$), hollow silicon dioxide spheres ($SiO_2$), including those with hollow, core, core-shell, and core-shell-ligand architectures.

The nanoparticles can be freely dispersed within the organic-matrix or bond to the organic-matrix through chemical affinity, ionic, or covalent bonding. The nanoparticles can be chosen to alter or tune the nanocomposite-ink material properties, such as the real or imaginary parts of the complex dielectric properties. Complex dielectric properties that can be altered by introduction of nanoparticles include the refractive-index, complex refractive index, second order nonlinear response, third order nonlinear response, and combinations thereof.

The organic-matrix can be any curable material that can host the nanoparticles dispersed within. For optical refractive applications the organic-matrix is at least partially transparent for the wavelengths of its intended use. In general, the organic-matrix preferably has a viscosity within the range required by the printing apparatus. For instance a viscosity of about 5 cP to about 200 cP is typical.

Diffusion of the nanocomposite-inks depend on a variety of factors which include the nanoparticle concentration, nanoparticle material types, nanoparticles size, nanoparticle shape, pH value of the nanocomposite-ink, viscosity of the nanocomposite-ink, temperature of the nanocomposite-ink, and surface functionalization of the nanoparticles. 2-dimension and 3-dimension diffusion effects and methods of measuring and controlling diffusion of nanocomposite-inks including diffusion inhibiting and diffusion permitting nanocomposite-inks is disclosed in U.S. patent application Ser. No. 14/863,297, assigned to the assignee of the present invention and the disclosure of which is hereby incorporated by reference in its entirety.

For a nanocomposite-ink with one nanoparticle type, the refractive index is given by the following equation:

$$n_{e\!f\!f}(\lambda) = V\%_{NP} \times n_{NP}(\lambda) + V\%_{OM} \times n_{OM}(\lambda),$$

where $n_{e\!f\!f}(\lambda)$ is the effective index of the nanocomposite-ink, $V\%_{NP}$ is the percent volume of the nanoparticles $n_{NP}(\lambda)$ is the refractive-index of the nanoparticles, $V\%_{OM}$ is the percent volume of the organic-matrix, and $n_{OM}(\lambda)$ is the refractive-index of the organic-matrix. Additional nanoparticles can be added and percent volume and refractive-index included in the equation.

The properties of the printing apparatus and the substrate determine, in part, the speed at which the nanocomposite-ink material are deposited and necessity to partially or fully cure when depositing layers. The properties of the printing apparatus include the droplet size, droplet velocity, droplet angle, printheads, nozzles per printhead, nozzle pattern, deposition speed, stage speed, stage resolution, and spatial cure pattern. The substrate properties include the material type, surface texture, wettability, coatings including hydrophobic and hydrophilic coating and gradient coating, and surface temperature.

Figure 2A:
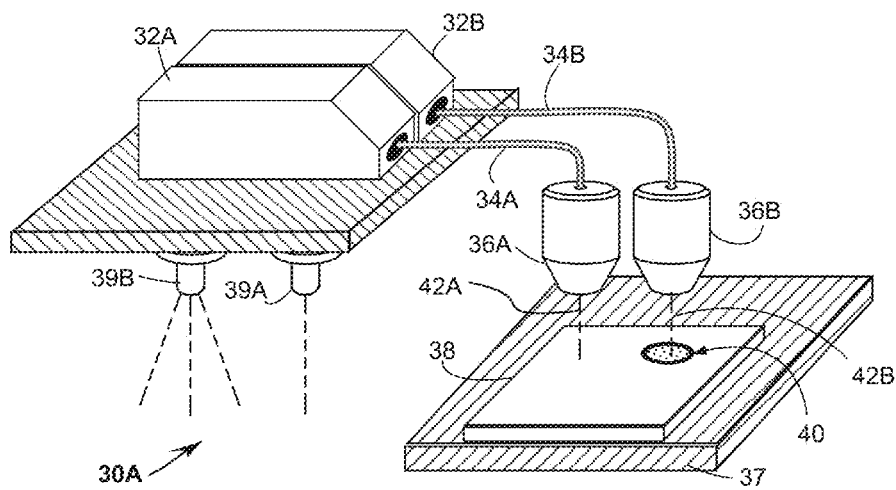
FIG. 2A is a perspective view schematically illustrating a two printhead inkjet printing apparatus for manufacture using methods in accordance with the present disclosure.

Referring to FIG. 2A, an inkjet printer 30A provides the basic features of the printing apparatus used in manufacture of nanocomposite-inks. Inkjet printer 30A has a reservoir 32A and 32B that hold a nanocomposite-ink 42A and 42B respectively. Reservoirs 32A and 32B provide a printhead 36A and 36B via a feed-lines 34A and 34B respectively. Printheads 36A and 36B deposit nanocomposite-ink 42A and 42B on a substrate 38 at voxels, thereby forming in part a volumetric continuous gradient complex dielectric device 40. Voxels refer to coordinate positions in 3-dimensional space. A stage 37 position substrate 38 with respect to the printheads for deposition at the desired voxels.

The printheads each have at least a nozzle, but in practice have several nozzles capable of printing hundreds and thousands of dots per inch depending on the number of the nanocomposite-inks per printhead. Each of the nozzles can independently actuate to dispense nanocomposite-ink. The nozzles can be spatially patterned, eject ink at angle, and combinations thereof. Depending on the inkjet printer, the nozzles can be actuated via piezo, thermally, electrostatic, or interrupted continuous flow mechanisms. Piezo actuated printhead eject ink by a piezo element within the printhead changing shape via applied voltage. The shape change generates a pressure pulse, or acoustic wave, in the fluid, forcing ink from the nozzle in volumes of about 1 picoliter (pl) to about 10 pl for nanocomposite-inks with viscosities that are under about 10 centipoise (cP). Thermally actuated printheads quickly heat and evaporate volatile liquid, often, water, in the ink such that a bubble forms causing displacement of the ink through the nozzle. The nanocomposite-inks with about 10 cP or less, produce droplets of 0.1 pl to 100 pl. Electrostatically actuated printheads use of a microelectromechanical (MEMs) mechanism to impart momentum to droplets of the same general size using the nanocomposite-inks of the same general viscosity. Interrupted continuous flow heads break up a continuous ejection out a nozzle with resonant application of a force perpendicular to the flow resulting in a repeatable, predictable stream of droplets, which can range from about 1 pl to 100 pl making use of fluids with viscosities of 200 cP or less. Droplets that are not required are deflected, using air impingement or electrostatic charge selectively applied, into a recycling channel alongside trajectory of the droplets to be used. The nozzles should be located in proximity to the substrate on which the nanocomposite-ink is being printed, dependent on the deposition accuracy required. For precise deposition, the printhead should be within a centimeter or less of the substrate.

Substrate 38 can be made from a variety of materials nonlimiting examples include glasses, metals, ceramic, and organic resins as well as functional devise such as circuits, electric components, photonics components, optical components, PCB boards and other such substrates. Substrate 38 can be surface treated with texturing or a coating to alter the surface contact angle between the substrate and the nanocomposite-ink droplets. Hydrophobic and hydrophilic coating can be applied to the substrate uniformly or in gradient profiles. During deposition, the substrate is preferably attached or fastened to the stage to allow stage movement without loss of spatial registration.

The printing apparatus may have a curing mechanism depending on the nanocomposite-ink composition. Here, inkjet printer 30A has a spatially discrete radiation source 39A and an area radiation source 39B. The sources are LED-based and emit ultraviolet radiation to selectively cure the UV polymerizable nanocomposite-inks. Selectively curing refers to localized radiation about voxels, activating the organic-matrix. Activation of the organic-matrix solidifies the nanocomposite-inks. Selective-curing means partial curing or fully curing. According to the curing schedule, substrate 38 is positioned with respect either the spatially discrete radiation source 39A or area radiation source 39B. Spatially discrete radiation source 39A illuminates particular voxels or voxels areas to partially or fully cure the nanocomposite-ink. Spatially discrete radiation source 39A can have a spot size in the microns, millimeter, or larger. Area radiation source 39B is used when all the nanocomposite-ink needs to be partially or fully cured. Area radiation source 39B preferably has a uniform illumination field in at least the 2-dimensional plane the nanocomposite-ink is deposited when deposited in layers, and preferably uniform in the 3-dimensional volumetric area in which the nanocomposite-ink is deposited.

While the radiation sources shown are UV sources, others such as visible, near-infrared, infrared, and far infrared can be implemented. The radiation source can be any optical source which emits spectral radiation which activates the nanocomposite-ink curing mechanism such as LEDs, lasers, lamps and can be equipped with beam delivery optics to either homogenize or otherwise control the illumination spot size.

During deposition of the nanocomposite-ink the ambient printing environment is preferably controlled by placing the printing apparatus in a glovebox or a controlled laboratory environment. Nonlimiting environmental factors which influence the printing process is pressure, humidity, and temperature of the printing environment. For instance the ambient temperature may cause shrinkage or expansion of the substrate or deposited nanocomposite-ink based on the coefficient of thermal expansion (CTE) differences. Additionally the ambient temperature will determine in part the viscosity of the nanocomposite-ink in both deposition and flow within the mold. The ambient pressure can be changed to allow passive release of tramped air bubbles in the nanocomposite ink. A meniscus may form in certain areas, especially in smaller mold cavities. The ambient pressure and ambient temperature will, along with the nanocomposite-ink and mold material properties determine the shape of the meniscus.

Figure 2B:
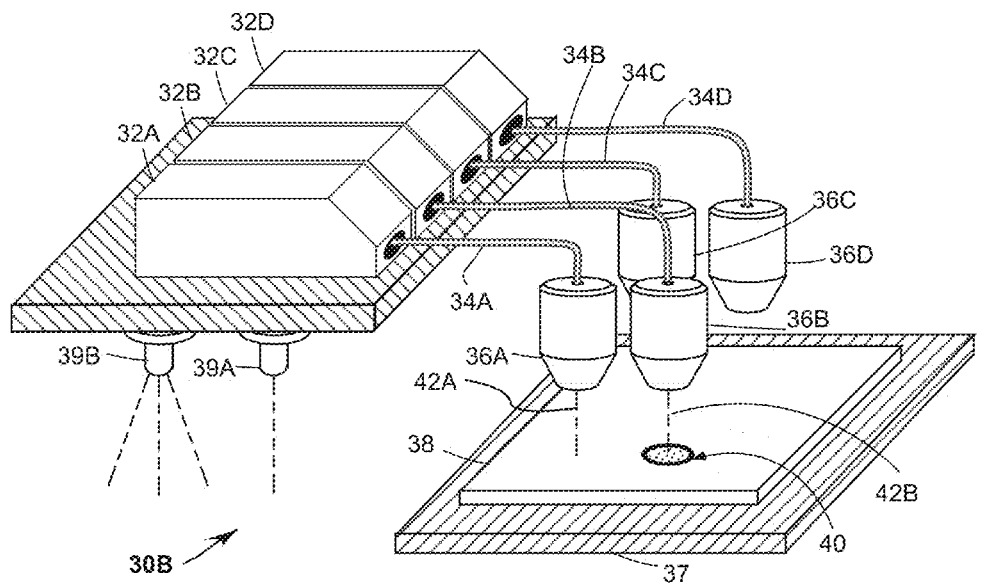
FIG. 2B is a perspective view schematically illustrating a four printhead optical printing apparatus for manufacture using methods in accordance with the present disclosure.

Referring to FIG. 2B, an inkjet printer 30B has that shown in FIG. 2A with an additional reservoir 32C and 32D, holding a nanocomposite-ink 32C and 32D, a feed-line 34C and 34D, and a printing heads 36C and 36D, respectively. The additional printing heads provide additional nanocomposite-ink different from the nanocomposite-ink in other printing heads. In practice printheads can be attached to a reservoir as shown or be integrated within a removable print cartridge delivering more than one type of the nanocomposite-inks. The removable print cartridge can have more than one type of the nanocomposite-inks.

Figure 3A:
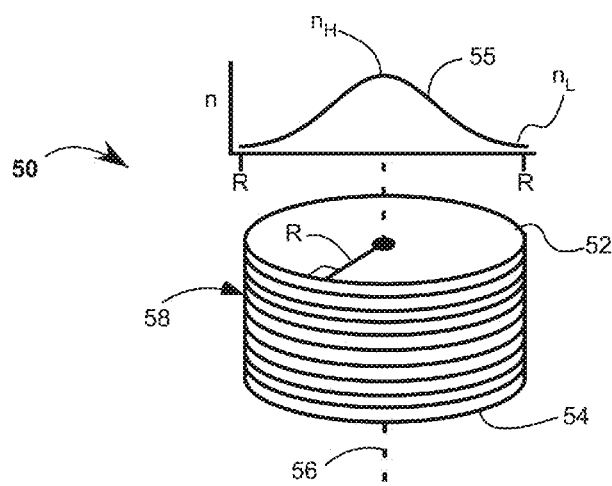
FIG. 3A is a perspective view of volumetric gradient complex dielectric device, here a wood lens.
Figure 3B:
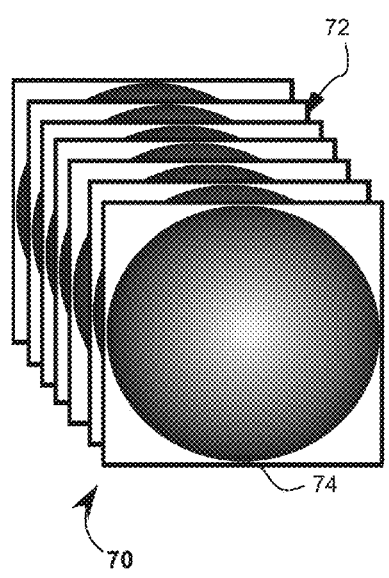
FIG. 3B is a plan view conceptually illustrating a multi-dimensional complex dielectric gradient profile comprising a plurality of 2-dimensional complex dielectric gradient profiles.
Figure 3C:
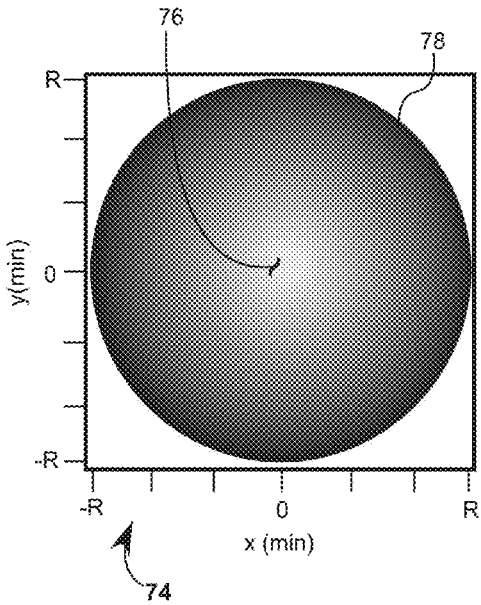
FIG. 3C is a plan view of one of the 2-dimensional complex dielectric gradient profiles of that shown in FIG. 3B.

Referring to FIG. 3A, FIG. 3B, and FIG. 3C, a volumetric gradient complex dielectric element 50, here a wood lens, is cylindrically shaped with a first surface 52 and a second surface 54. The wood lens has a complex dielectric gradient 55 wherein the real part of the complex dielectric varies from a high refractive index $n_H$ to a low refractive index $n_L$ in a symmetric parabolic path from an axial center axis 56 to a radial edge R. The volumetric complex dielectric device can be described as a series of 2-dimensional layers 58.

A multidimensional gradient profile 70 is representative of wood lens 50. Multidimensional complex dielectric gradient profile 70 comprises a series of 2-dimensional complex dielectric gradient profiles 72 wherein each describe a cross-section of the wood lens along the axial center. A 2-dimensional complex dielectric gradient profile 74 is shown greyscale with a refractive-index $n_H$-represented in white at a center 76 and a low-refractive index $n_L$ represented in black at a radial edge 78. For convenience, the multidimensional volumetric complex dielectric gradient profile is represented in x-y-z Cartesian coordinates but other coordinates systems can be used including polar, spherical, spherical, curvilinear, quadratic and other Euclidean and non-Euclidean domains.

To determine manufacture the wood lens one of the plurality of nanocomposite-inks must have a refractive-index value as low or lower then low-refractive index $n_L$ and one must have a refractive index as high or higher than high-refractive-index $n_H$. With at least two of the nanocomposite-inks, a composition of the nanocomposite-inks can be determined to obtain the intermediate refractive-index values and extremes, if necessary. A first order approximation is given by the following equation:

$$n_{DEP}(\lambda) = V\%_{NC1} \times n_{NC1}(\lambda) + V\%_{NC2} \times n_{NC2}(\lambda) \ldots,$$

where $n_{DEP}(\lambda)$ is the refractive-index of the nanocomposite-ink mixture, $V\% N_{NC1}$ and $n_{NC1}(\lambda)$ are the percent volume and refractive-index of the first nanocomposite-ink in the mixture, and $V\%_{NC2}$ and $n_{NC2}(\lambda)$ are the percent volume and refractive-index of the second nanocomposite-ink. In general, the more nanocomposite-inks types available, the higher fidelity the printed nanocomposite-ink structure will have with respect to the intended 3-dimensional volumetric complex dielectric gradient profile.

Figure 4A:
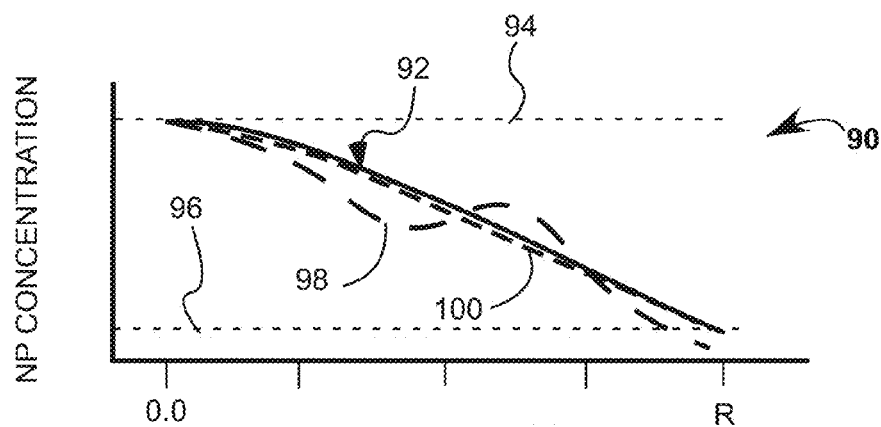
FIG. 4A is a graphical representation of a parabolic nanocomposite-ink concentration gradient.

FIG. 4A, FIG. 4B, FIG. 4C, and FIG. 4D illustrate deposition and respective gradient profiles in 1-dimension. Referring to FIG. 4A, a graph 90 has a section of a parabolic volumetric nanocomposite-ink concentration gradient 92. Parabolic concentration gradient 92 transition from a high nanoparticle concentration 94 and to a low intermediate refractive index 96. A concentration gradient profile 98 is representative of printing with two of the nanocomposite-inks, the droplet structure shown in FIG. 4C. A concentration gradient profile 100 is representative of printing with four of the nanocomposite-inks, the droplet structure shown in FIG. 4D. Here, mismatch between the two and four nanocomposite-ink is for illustrative purposes.

Figure 4B:
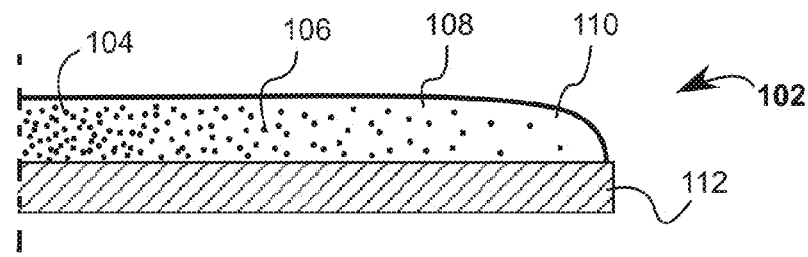
FIG. 4B is a cross-section view of a nanocomposite-ink structure.

Referring to FIG. 4B, an nanocomposite-ink structure 102 is the nanocomposite-ink structure represented by the nanocomposite-ink concentration gradient as that shown in FIG. 4A. Nanocomposite-ink structure 102 has the volumetric equivalent of six nanocomposite-ink droplets on a substrate 112. Nanocomposite-ink structure 102 has a high nanoparticle concentration 104, a medium nanoparticle concentration 106, a low nanoparticle concentration 108 and a very low nanoparticle concentration 110. The nanoparticle concentration transition from high-to-low from right-to-left.

Figure 4C:
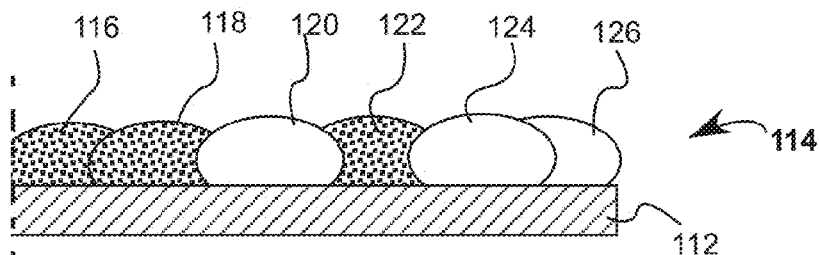
FIG. 4C is a cross-section view of a two nanocomposite-ink deposition structure.

Referring to FIG. 4C, a two nanocomposite-ink structure 114 has six nanocomposite-ink droplets. Two nanocomposite-ink structure 114 has three high nanoparticle concentration nanocomposite-inks droplets and three very low nanoparticle concentration nanocomposite-inks. From left-to-right, a high-index nanocomposite-ink droplet 116 is adjacent to a high-index nanocomposite-ink droplet 118, adjacent to a low-index nanocomposite-ink droplet 120, adjacent to a high index nanocomposite-ink droplet 122, adjacent to a low index nanocomposite-ink droplet 124, which is adjacent to a low index nanocomposite-ink droplet 126. As deposited nanoparticles diffuse from high concentration areas to low concentration areas resulting in the concentration gradient profile 98 as shown in FIG. 4A.

Figure 4D:
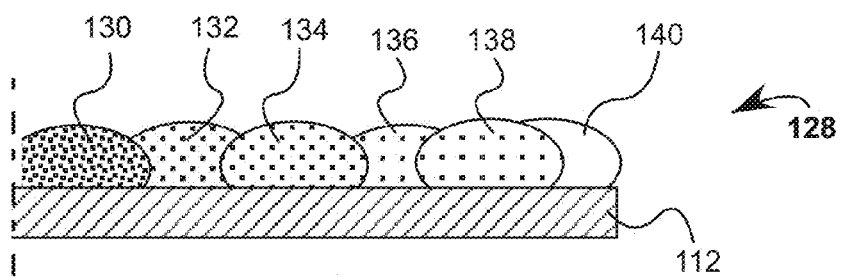
FIG. 4D is a cross-section view of a four nanocomposite-ink deposition structure.

Referring to FIGS. 4D and 4B, a four nanocomposite-ink structure 128 has six nanocomposite-ink droplets. A high nanoparticle concentration nanocomposite-ink droplet 130 has a nanoparticle concentration such that the refractive-index is about the same concentration as high nanoparticle concentration 104. From left-to-right, a medium nanoparticle concentration nanocomposite-ink droplet 132 and 134 have a nanoparticle concentration about the same as medium nanoparticle concentration 106. A low concentration nanoparticle concentration nanocomposite-ink droplet 136 and 138 have a nanoparticle concentration about the same as low nanoparticle concentration 108. Last, a very low nanoparticle concentration nanocomposite-ink droplet 140, for instance, a neat organic-matrix, has a nanoparticle concentration about the same as nanoparticle concentration 110.

As compared to the two nanocomposite-ink structure, the four nanocomposite-ink structure more closely matches the nanocomposite-ink structure due to nanoparticle concentration match at multiple point along the nanoparticle concentration gradient profile. While the 1-dimensional examples illustrates the benefit of multiple inks, in practice, diffusion occurs at least in 2-dimensions and 3-dimensions depending on the print schedule. The 2-dimension and 3-dimension nanoparticle diffusion will determine in part the size of a print tile.

Figure 5A:
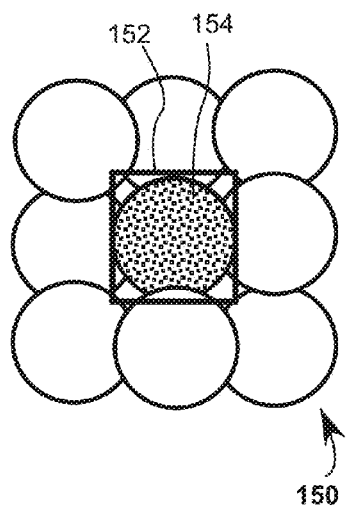
FIG. 5A is a plan view of a 2-dimensional droplet pattern wherein a print tile is the size of a nanocomposite-ink droplet.

Referring to FIG. 5A, a 2-dimensional droplet pattern 150 has a print tile 152 with a size that is the volumetric equivalent of a nanocomposite-ink droplet 154. Droplet pattern 150 illustrates nine nanocomposite-ink droplets. In general, the print tile can sized as small as the nanocomposite-ink droplet volume or larger. For instance, the print tile can be modeled based on predetermined diffusion effects, a set number of droplets, or the size of a predetermined cross-hatch pattern. The print tiles can comprise of sub-tiles, the sub-tiles patterned within the print tiles. Here the print tile is square shape.

Figure 5B:
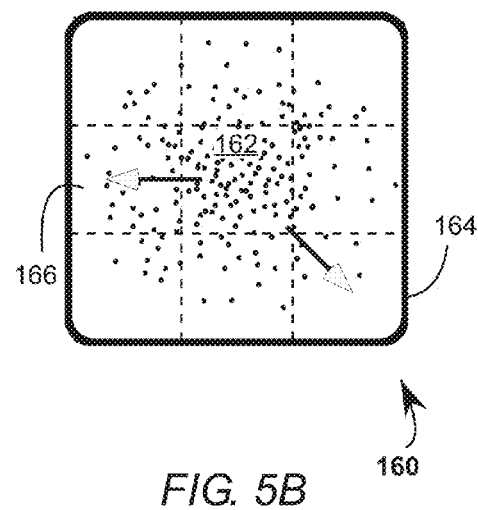
FIG. 5B is a plan view illustrating a print tile the volumetric size of nine nanocomposite-ink droplets.

FIG. 5B illustrates a print tile 160, wherein print tile 160 is the volumetric size of nine nanocomposite-ink droplets. Here dashed lines represent approximate borders of the nanocomposite-ink droplets and have the same droplet pattern as that shown in FIG. 5A. The print tile is about the size of the diffusion length of a nanocomposite-ink droplet 162 into a neighboring nanocomposite-ink droplet areas 164 and 166 based on the same droplet pattern as that shown in FIG. 5A. Depending on the dithering technique used and the diffusion length of nanoparticles, it can be convenient for the print tile to size according to the extent of nanoparticle diffusion based on a predetermined diffusion time, diffusion rate and cure to match a particular dithering technique according to the particular dithering technique. Similarly print tile be sized according to predetermined dither patterns to achieve a particular refractive index or gradient refractive index profile.

Figure 5C:
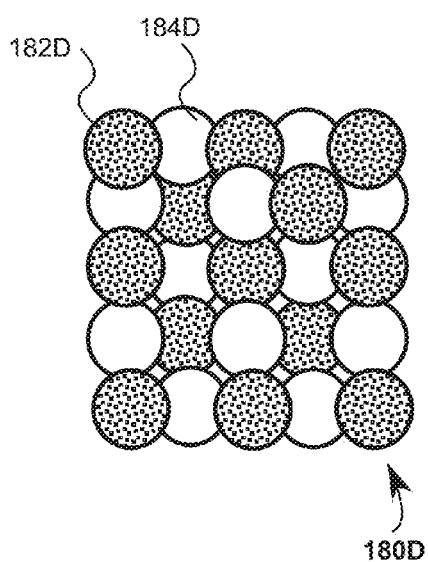
FIG. 5C is a plan view of a 2-dimensional droplet pattern with a cross-hatch pattern.
Figure 5D:
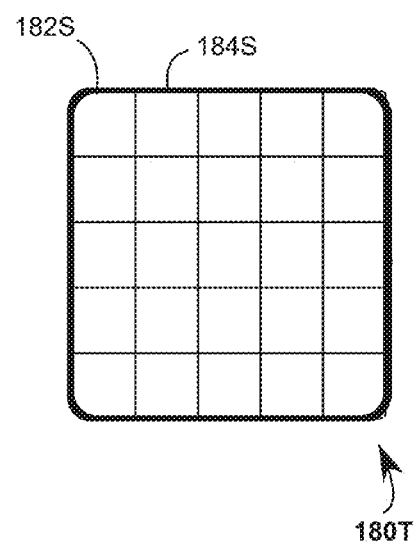
FIG. 5D is a plan view illustrating a print tile of the 2-dimensional droplet pattern shown in FIG. 5C.

Referring to FIGS. 5C and 5D a 2-dimensional droplet pattern 180 has a dither pattern which consists of a diagonal cross-hatch pattern. Droplet pattern 180 is a square five nanocomposite-ink droplet by five nanocomposite-ink droplet corresponding to a print tile 180T. Here a nanocomposite-ink droplet 182D which has a high nanoparticle concentration and is adjacent to a nanocomposite-ink droplet 184 with a low nanoparticle concentration correspond to a sub-tile 182S and a sub-tile 184S, respectively. The high to low droplet pattern continues such that each droplet is diagonally adjacent to a nanocomposite-ink droplet.

When determining the printing schedule each of the print tiles or the subtiles cab be assigned a printing priority. Assigning each of the sub-tiles a printing priority within each print tile can increase homogenization. The print priority can be reordered randomly or deterministically. For instance, print tile 180T can be deposited in order according to a raster print pattern, if a subsequent print tile requires the same print tile, the order that each of the sub-tile can be randomized, the order can be shifted, reversed or other such perturbations. Further the print tile pattern can be spatially altered as described further below.

Figure 6A:
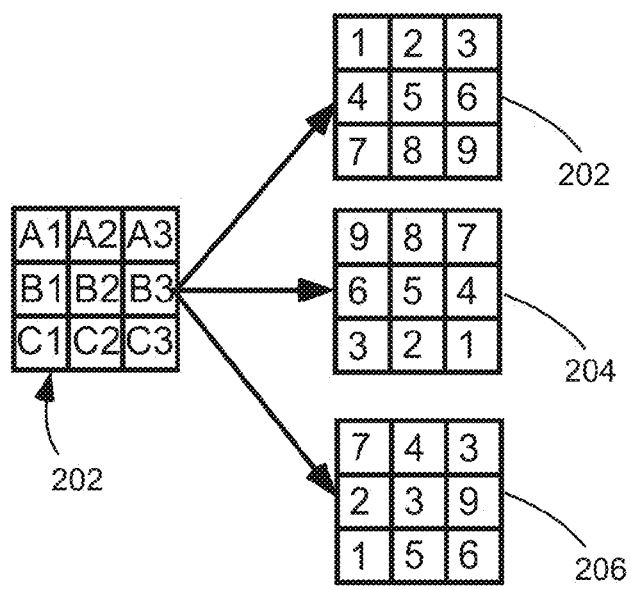
FIG. 6A is a plan view of a print tile illustrating various method of reordering prioritization of deposition of the print tiles.

FIG. 6A illustrate a print tile set 200 illustrating various methods of temporally reordering print priority. Here a print tile 202 has a total of nine sub-tiles comprising of a sub-tile A1, A2, A3, B1, B2, B3, C1, C2, and C3. In a first print priority 202 the order of the nanocomposite-ink droplet deposition is in a raster pattern from left to right progressing through each row. In a second print priority 204 the order of the nanocomposite-ink droplet deposition is in a reverse raster pattern from left to right progressing through each row. In a third print priority pattern 206, the order of nanocomposite-ink droplet deposition is arbitrarily randomized.

Figure 6B:
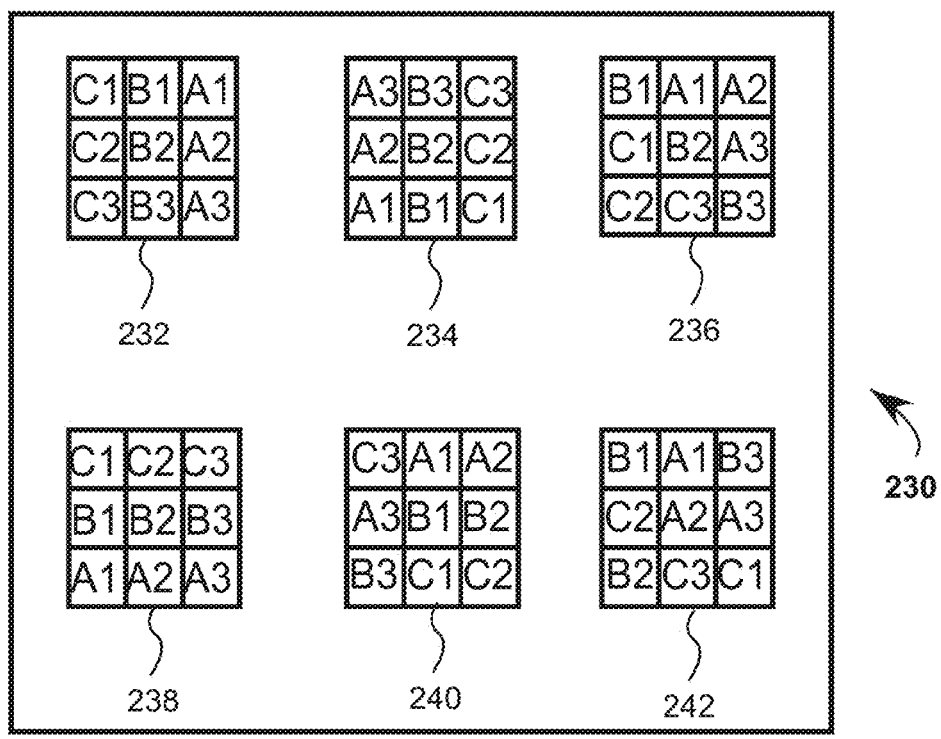
FIG. 6B is a plan view of a print tile illustrating various spatial re-orderings of subtiles.

Referring to FIG. 6B, a print tile set FIG. 6B a print tile set 230 illustrates various nonlimiting examples of spatially reordering sub-tiles within print tiles. The Sub-tiles are referenced from an original orientation of print tile 202 as that shown in FIG. 6A. A print-tile 232 and a print tile 234 are 90° clockwise and counter-clockwise spatial rotations of print tile 202. A print tile 236 is a sub-tile rotation around center sub-tile B2. A print tile 238 has the first row swapped with third row. A print tile 240 has a single subtitle position shift to the right following a raster pattern. A print tile 242 has randomly distributed sub-tile positions.

Figure 7A:
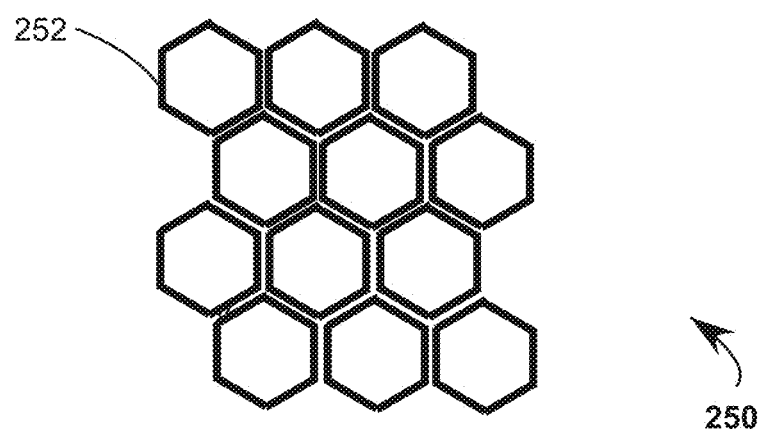
FIG. 7A is a plan view illustrating a hexagonal print tile.
Figure 7B:
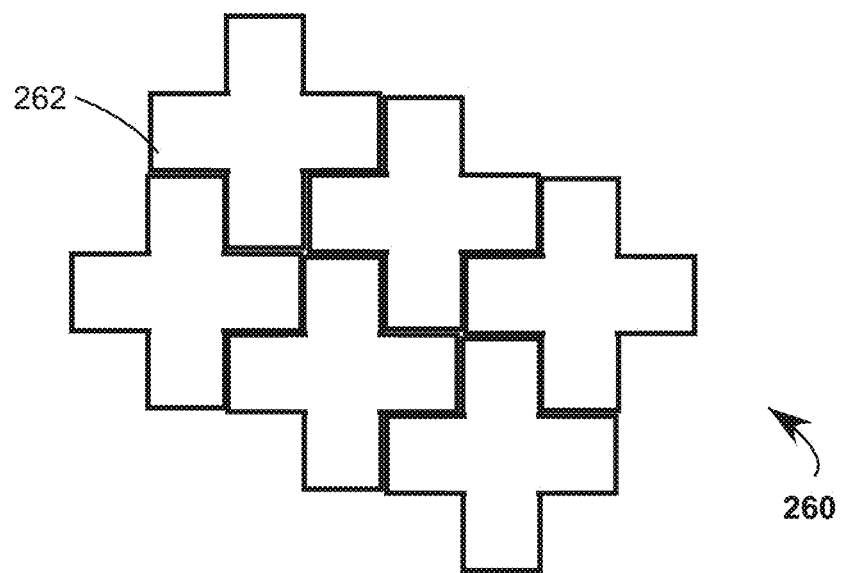
FIG. 7B is a plan view of a fractal print tile.

The aforementioned print-tiles illustrate square shapes although other shapes such as hexagonal, fractals, or other volumetrically filling structures can be used to represent print tiles and sub-tiles. Referring to FIG. 7A a print tile 250 has an hexagonal shaped sub-tile 252 and eleven identically shaped hexagonal sub-tiles arranged in a repeatable volumetric filling pattern. Referring to FIG. 7AB, a print tile 260 has a fractal shaped sub-tile 262 and five identically shape fractal shaped sub-tiles arranged in a repeatable volumetric filling pattern.

Figure 8:
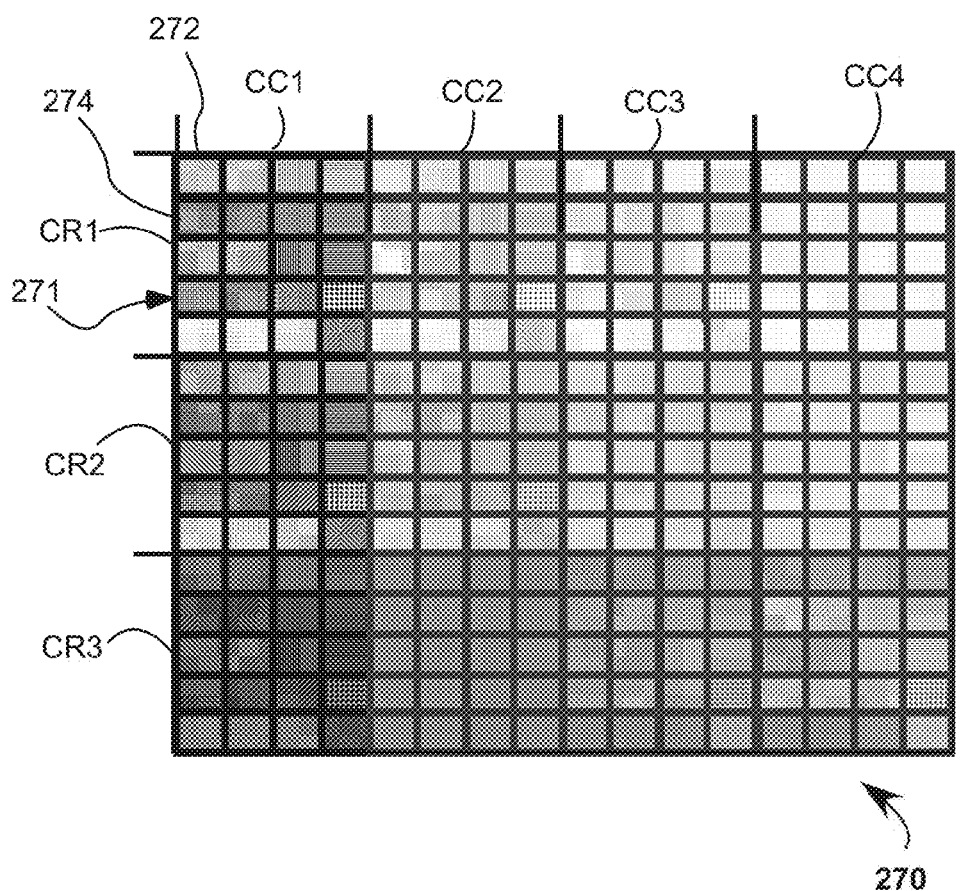
FIG. 8 is a plan view of various deposition patterns.

Various patterns can be applied to the print tile and sub-tiles to accommodate diffusion and in order to obtain particular complex refractive-index values. FIG. 8 illustrates nonlimiting examples of cross-hatch patterns that can used in the methods of the present disclosure. Such cross-hatch patterns can be applied as print tiles in a general dither techniques or in a calibration table as described further hereinbelow.

Referring to FIG. 8, a pattern set 270 illustrates a set of print tiles or sub-tiles patterns with intermediate nanocomposite-ink nanoparticle concentrations illustrated in grey-scale. Each of the cross-hatch pattern print tiles are referenced a row TR1, TR2, and TR3 and a column TC1, TC2 and TC3. Row CR1 and column TC1 have a five-by-four pattern grid 271 of various nanocomposite-ink cross-hatch patterns. The same four-by-four pattern the structure of which is repeated within each designated reach row and column with various concentrations of nanocomposite-inks, alterations in pattern dimension, or cure schedule. The cross-hatch patterns can be varied by pattern, nanocomposite-ink type, volumetric contribution of nanocomposite-inks, and orientation.

Such cross-hatch patterns can be deposited and measured to determine spatial-frequency components of the plurality of nanocomposites-inks at various concentrations and orientations. Further such patterns can be used to achieve constant concentration profiles. For example, an exemplary cross-hatch pattern 272 has a series of low and high concentration nanocomposite-inks in a diagonal orientation such that a lower concentration nanocomposite-inks are deposited. Another exemplary cross-hatch pattern 274 has an about equal concentration of both low and high concentration nanocomposite-inks.

Figure 9A:
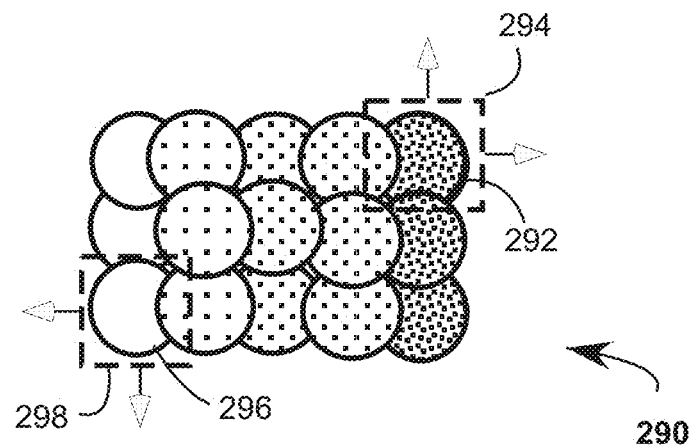
FIG. 9A is a plan view illustrating a spatial print pattern wherein a single nanocomposite-ink droplet include a spatial noise component.
Figure 9B:
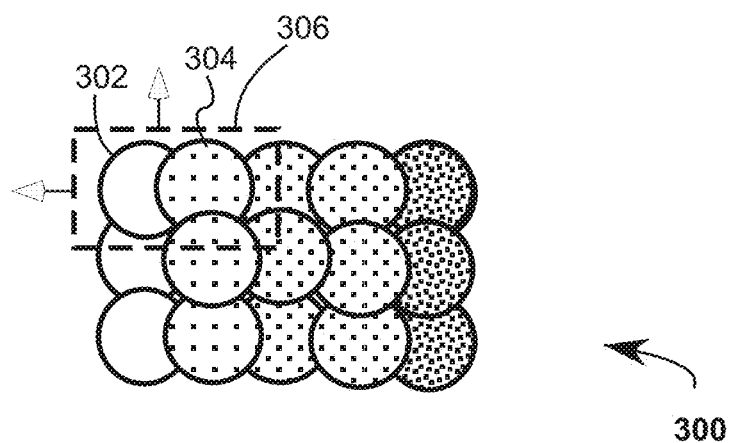
FIG. 9B is a plan view illustrating a spatial print pattern wherein a group of nanocomposite-ink droplets include a spatial noise component.
Figure 9C:
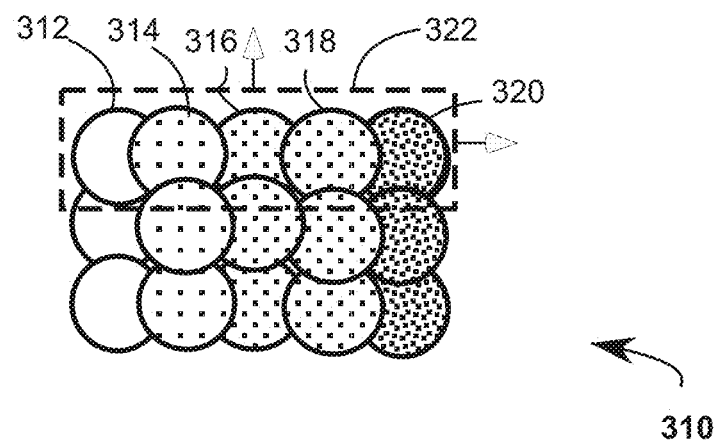
FIG. 9C is a plan view illustrating a spatial print pattern wherein a row of the nanocomposite-ink droplets have a spatial noise component.

Noise components can be added by the aforementioned sub-tile techniques or spatial position shifts of single droplet, sets of grouped droplets, sub-tiles, print tiles, or 2-dimensional print mask. For instance a 2-dimensional print mask representing a single layer can be spatially translated with respect to another 2-dimensional print mask by a distance less than the size of a nanocomposite-ink droplet. Addition of spatial noise to droplets position can reduce undesired frequency components due the mechanics and resolution of the printing apparatus. FIG. 9A, FIG. 9B and FIG. 9C provide various methods of introducing spatial noise.

Referring to FIG. 9A, a nanocomposite droplet pattern 290 has a spatial print pattern including introduction of a noise component based on single nanocomposite-ink droplet coordinates. Here a nanocomposite-ink droplet 294 and a nanocomposite-ink droplet 296 have a coordinate shift 294 and a coordinate shift 298 from the nominal position. The coordinate shift's nominal bounds are represented by a dashed square encompassing border. The coordinate shift is preferably a distance less than the size of the nanocomposite-ink droplet. Here, only two nanocomposite-ink droplets are shown, but each droplet can be shifted depending on the desired magnitude of noise desired. The coordinate shift is preferably a distance less than the size of the nanocomposite-ink droplet.

Referring to FIG. 9B, a nanocomposite-ink droplet pattern 300 has a spatial print pattern including introduction of a noise component based on sets of grouped nanocomposite-ink droplet coordinates. Nanocomposite-ink droplet pattern 300 has a nanocomposite-ink droplet 302 and a nanocomposite-ink droplet 304. Nanocomposite-ink droplets 302 and 304 have a coordinate shift 306, the two droplets maintain their spatial relationship with respect to one another.

Referring to FIG. 9C, a nanocomposite-ink droplet pattern 310 has a spatial print pattern including introduction of a noise component based on an entire row of grouped nanocomposite-ink droplet coordinates. Nanocomposite-ink droplet pattern 310 has a nanocomposite-ink droplet 312, a nanocomposite-ink droplet 314, a nanocomposite-ink droplet 316, a nanocomposite-ink droplet 318, and a nanocomposite-ink droplet 320. Nanocomposite-ink droplets 312, 314, 316, 318, and 320 are in a shared row and have a coordinate shift 322. Here, the coordinate shift is along an entire row. Such a coordinate shift can be desirable based on the print path of the print path. For instance if the print path is raster based or serpentine, then spatial shift in relation to the print path direction can alleviate undesirable frequency components due to the printing regularity. Likewise, if a print path follows isoindicial paths or contours, then a coordinate shift along the same isoindicial paths of contours can be desirable.

The print mask and print path can follow a raster, serpentine, vector based patterns, space-filling curvatures, or follow isodindical paths and contours and combinations thereof. Alternatively the print path can follow linear or nonlinear paths oblique to isodindicial contours or otherwise follow paths with low or no correlation to isoindicial contours. When depositing subsequent layers, modification of the print mask or the print path from layer to layer can be desirable to achieve higher fidelity or otherwise ensure volume filling. When using a dithering technique with adaptive print mask, the origin of the print path can be based on the center of mass or magnitude or at least one physical parameter. Nanocomposite-inks can be deposited in a variety of patterns in order to obtain the required refractive index value.

Figure 10:
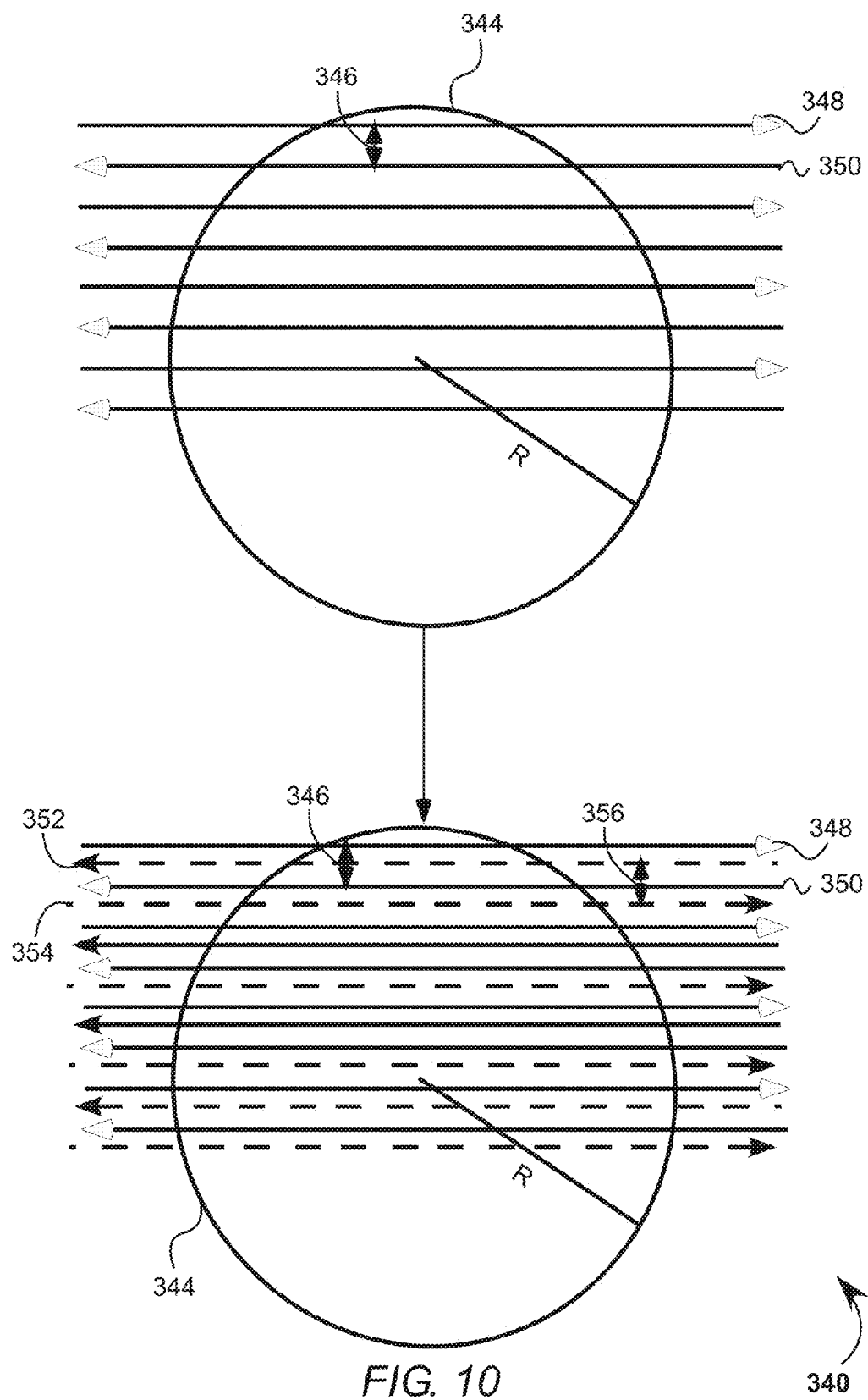
FIG. 10 is a plan view illustrating a raster print or serpentine print path.

Referring to FIG. 10, a shifted print path 340 illustrates deposition of a serpentine print path 342 and a subsequent space filling print path 348. Here, a first serpentine print path 342 prints the nanocomposite-ink to form a non-homogenous complex dielectric device 344 from left-to-right in a linear path 346, then shifts a distance 346, print in a linear path 350 from right-to-left. The shift distance 346 can be about the size of a nanocomposite-ink droplet or larger. The pattern continues in the serpentine pattern depositing the nanocomposite-ink droplet according the print priority. In a second pass the serpentine pattern follows a linear path 352 right-to-left depositing in the area between linear path 348 and linear path 350, then shifts a distance 356 the same as shift distance 346. The pattern continues in the serpentine pattern. Subsequent serpentine patterns and shift distances on subsequent passes fill in the areas according to the print schedule.

Figure 11A:
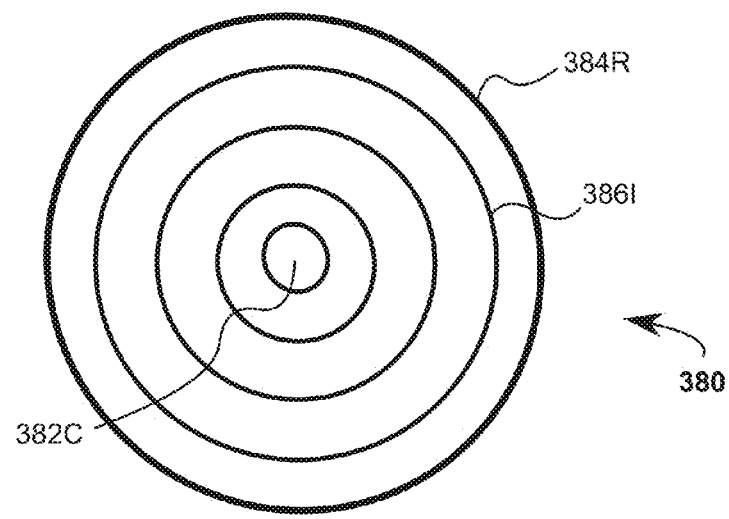
FIG. 11A is a plan view of a cross-section of a wood lens illustrating isoindicial contours.
Figure 11B:
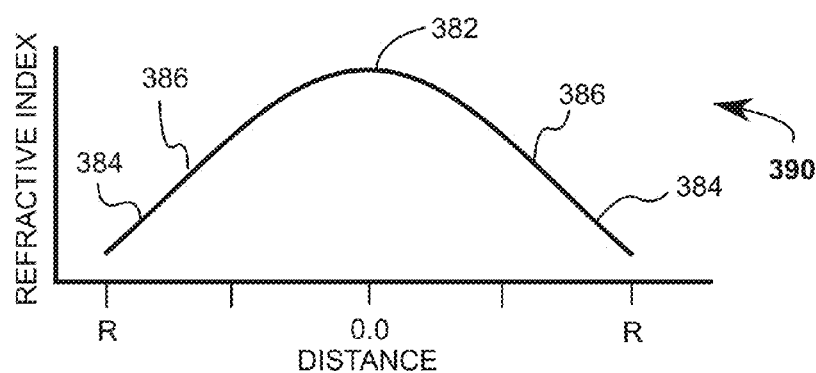
FIG. 11B is a graphical representation of the cross-section of the wood lens as that shown in FIG. 11A.
Figure 11C:
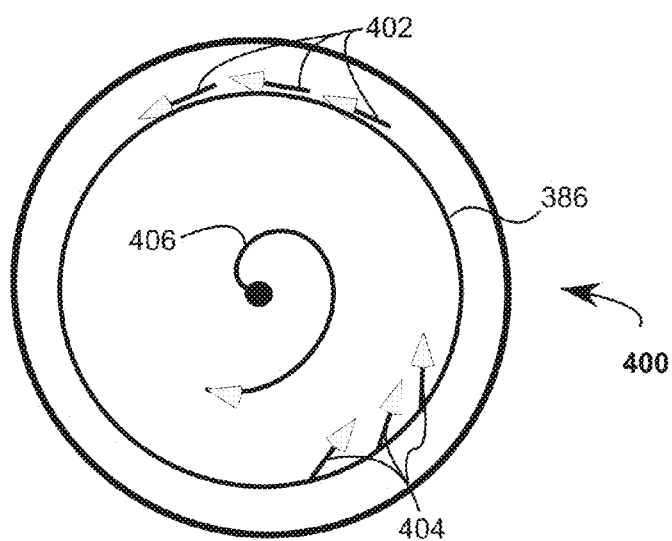
FIG. 11C is a plan view of the cross-section of the wood lens shown in FIG. 11A, illustrating various print paths.

Referring to FIG. 11A, FIG. 11B, and FIG. 11C, a cross-section of a wood-lens has isoindicial contours 380 representative of parabolic gradient refractive-index. Isoindicial contours 380 is characterized by a refractive-index 382 at a center 382C, a refractive index 384 at a radial edge 384R, and a refractive-index 386 along following an exemplary isoindicial path 3861. A set of print path 400 illustrate various print path examples for the deposition schedule to follow. A print path 402 follows isoindicial path 3861. A print path 404 follows paths oblique to isoindicial path 404. A print path 406 follows a spiral pattern originating from center 382C. Following isoindicial paths allow allows consistent deposition, uniform diffusion, and higher fidelity.

The print mask can incorporate error diffusion techniques that can aid determination of the print masks. For instance an error diffusion techniques can be used to determine the nanocomposite-ink to deposit. Error diffusion techniques can be applied on a droplet by droplet basis, for instance when the print tile is the same size as the nanocomposite-ink droplet, or can be based on larger print tiles. Unlike inkjet printing, a droplet must be deposited to fill volumetric space. The degree of error diffusion is directly related to the degree of nanoparticle diffusion. Error can be pushed in 2-dimensions with algorithms similar to Floyd-Steinburg, Jarvis-Judice-Ninke, Stucki, Atkinson, Burkes, which are convenient to many image processing software packages but are based on optimization for visualization by human psychophysical response and have no theoretical basis for optimal solutions in printing opics. Computational efficient algorithms such as the Floyd-Steinburg dithering technique can be used, but unlike traditional inkjet printing and color rendering applications, computational efficiency does not outweigh fidelity concerns given practical time consideration in the printing process. In one embodiment, other dithering error diffusion techniques, including other print tile sizes matching the extent of nanoparticle diffusion, magnitude and orientation of gradient orientations, printhead travel and interdot deposition times, and curing schedule should be used. In another embodiment, the print mask is adaptive. The adaptive print mask changes composition during print, based on the local spatial frequency, magnitude, and direction of the gradient. Preferably, dithering techniques are applied and modified per nanoparticle diffusion processes, including curing processes, which lead to the highest fidelity between the volumetric gradient complex dielectric device and the printed article.

Aforementioned error diffusion techniques can be modified to accommodate a plurality of nanocomposite-inks. For instance when using three of the nanocomposite-inks with varying nanoparticle concentration, at least three different thresholds can be used. A concentration gradient's low and peak concentration values can be normalized to a 256 integer scale. 0 representing the low nanocomposite-ink concentration and 256 representing the highest nanocomposite-ink concentration. An intermediate nanocomposite-ink, for instance 50% of the highest concentration, is represented as 128. When determining the print schedule, a print tile with an error of 0-64 will require deposition of the low nanocomposite-ink, 65-191 will require the intermediate nanocomposite-ink droplet, and a print tile with an error larger than 191 will require of the high nanocomposite-ink. Additional thresholds can be designated based on the print tiles with various dithering patterns. Error diffusion techniques can be applied to the print tiles and error diffusion models can adjusted based on the diffusion of the print tiles, although this method is only practical for smaller print tiles in which nanoparticle diffusion is practically accommodated.

The error diffusion techniques can follow a path similar such that each print tile, or volumetric area, is processed once, and error propagated forward to unprocessed print tiles or areas. The error diffusion path can follow raster, serpentine, rotations symmetric, or other such patterns. For devise wherein multiple discrete volumetric devices are incorporated, the error diffusion path can originate and end within bounds defined by the volumetric areas. Similar to the print path, the error diffusion path can continuously flow through layers, or terminate and originate in new locations either deterministically or randomly on various layers.

Figure 12A:
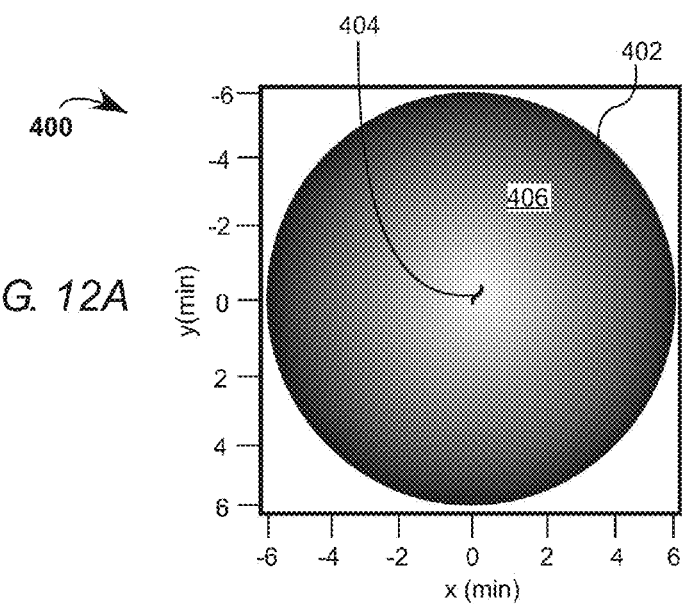
FIG. 12A is a plan view of a cross-section of a 3-dimensional volumetric nanocomposite-ink concentration gradient.
Figure 12B:
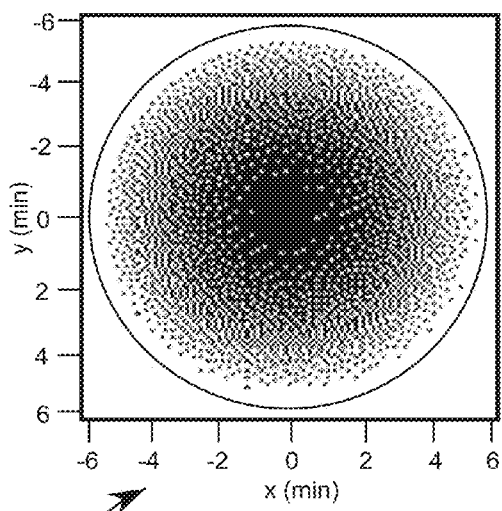
FIG. 12B is a cross-section view of a 2-dimensional print mask illustrating droplet coordinates of a low concentration nanocomposite-ink.
Figure 12C:
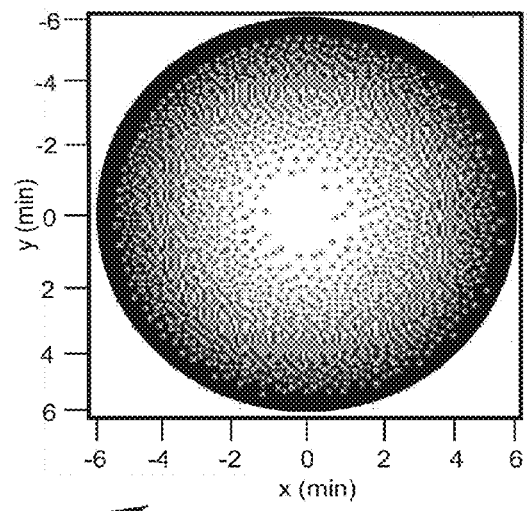
FIG. 12C a cross-section view of a 2-dimensional print mask illustrating droplet coordinates of a high concentration nanocomposite-ink.

Referring to FIGS. 12A, 12B, and 12C, a cross-section of a multidimensional gradient profile 400 is based on a low concentration nanocomposite-ink and a high concentration nanocomposite-ink. Gradient profile 400 has a concentration gradient with a low nanocomposite-ink concentration 404 illustrated in white and a high nanocomposite-ink concentration 402 illustrated in black with intermediate values between in greyscale. Based on aforementioned print mask techniques a discretized pattern 420 based on an applied print mask illustrates deposition position of one of the nanocomposite-inks and a discretized pattern 430 illustrates deposition of the other nanocomposites-ink wherein deposition position is illustrated as dark areas or dots.

Unlike inkjet printing psycho-physics based diffusion, nanoparticle diffusion occurs in 3-dimensions. Subsequent droplet deposition will diffuse into underlying and adjacent nanoparticle droplets. Print masks can propagate the diffusion effects as they are processed per print tile or subtile in 3-dimensions.

Figure 13A:
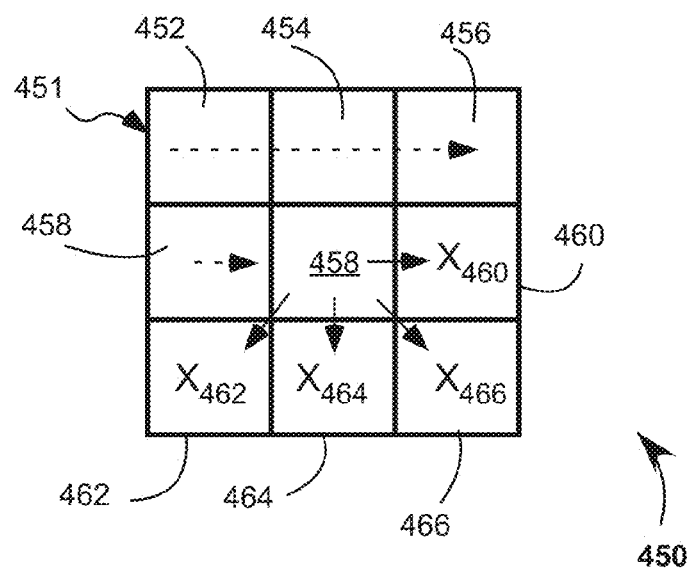
FIG. 13A is a plan view conceptual illustration of a 2-dimensional error diffusion model wherein nanoparticle diffusion is propagated in a raster or serpentine pattern.

Referring to FIG. 13A, a print mask 450 propagates error in an error diffusion pattern 451 conceptually similar to the floyd-steinburg algorithm. In the present algorithm error is pushed according to raster path to adjacent pixels based on a threshold according to the number of the nanocomposite-inks provided as described above. Here a print tile 452, 454, 456, and 458 have been assigned a nanocomposite-ink or a combination thereof. Depending on the error pushed to a print tile 458, the remaining error will be distributed to a print tile 460, 462, 464, and 466 according to the error diffusion distribution constants $X_{460}$, $X_{462}$, $X_{464}$, $X_{466}$, assigned respectively. Each of the distribution constants are preferably determined based on calculated, preferably measured, nanocomposite-ink nanoparticle diffusion characteristics.

Figure 13B:
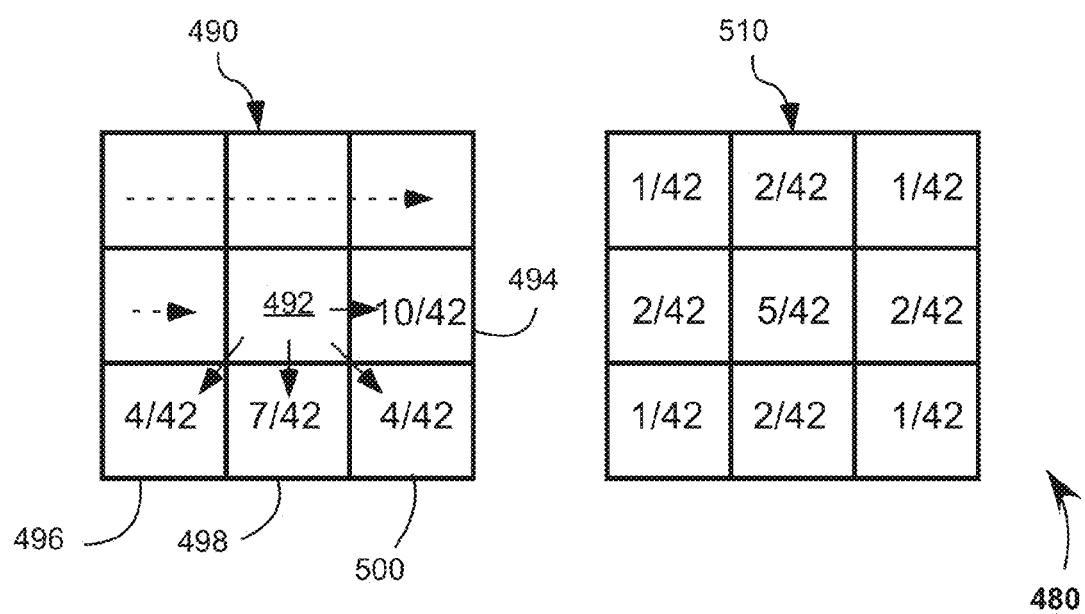
FIG. 13B is a plan view conceptual illustration of a multidimensional print mask.

Referring to FIG. 13B, a 3-dimensional print mask 480 pushes error in a raster pattern similar to that shown in FIG. 12A, further computing subsequent layers thereby. Here a print mask pattern 490 distributes error on a 2-dimensional plane processing a pixel 492 and distributing that beyond the threshold to a pixel 494, 496, 498, and 500. Print mask pattern 480 distributes that beyond the threshold to a subsequent deposition layer via an print mask pattern 510. No print tiles have been processed in the subsequent layer so print mask pattern 510 distributes to each of the 9 print tiles. Here the distribution is based on a 42 bit scale, although higher resolution scales can be implemented. Additionally, while only 9 print tile diffusion models are shown, other shapes, volumes and patterns can be implemented.

The magnitude of print mask values can take into account the print schedule if predetermined parameters are known. For instance, some areas or entire layers may be partially or fully cured and therefore have limited nanoparticle diffusion into subsequently deposited droplets. The error can be redistributed based on a predetermined cure schedule or print path. Alternatively the print path and the cure schedule can be adjusted to increase or decrease diffusion based on error between modeled results. For instance areas that require increased diffusion can be prioritized for deposition or be provided additional time to diffuse before cure.

The print mask origin can be placed arbitrarily or be based on a physical parameter of the intended device. For instance origin can be placed at the center of mass of the nanoparticle concentration, complex dielectric, or other such parameter. Alternatively, the origin can be placed to propagate error from areas of low nanoparticle concentration to high nanoparticle concentration or vice versa. The print mask can follow paths according to the print path, or paths uncorrelated to the print path. The print mask can follow isocontuours with respect to at least one physical parameter, for instance isoindicial paths that follow the real or imaginary parts of the complex dielectric. For volumetric gradient complex dielectric elements with volumetric structures, for instance lens arrays and compound optical systems, the print mask can be applied and change individually based boundary conditions between the volumetric structures.

For forward propagating error diffusion models, the threshold and selection of nanocomposite-ink can be determined based on the accumulated error on the currently processed print tile and also determined in part on error propagation based on the diffusion properties of the nanocomposite-ink. For instance, diffusion can be weighted based on the currently processed print tile and the adjacent neighboring print tile. In addition to forward error propagating diffusion models, iterative error diffusion processes, local, and globally aware models can be implemented.

Figure 14A:
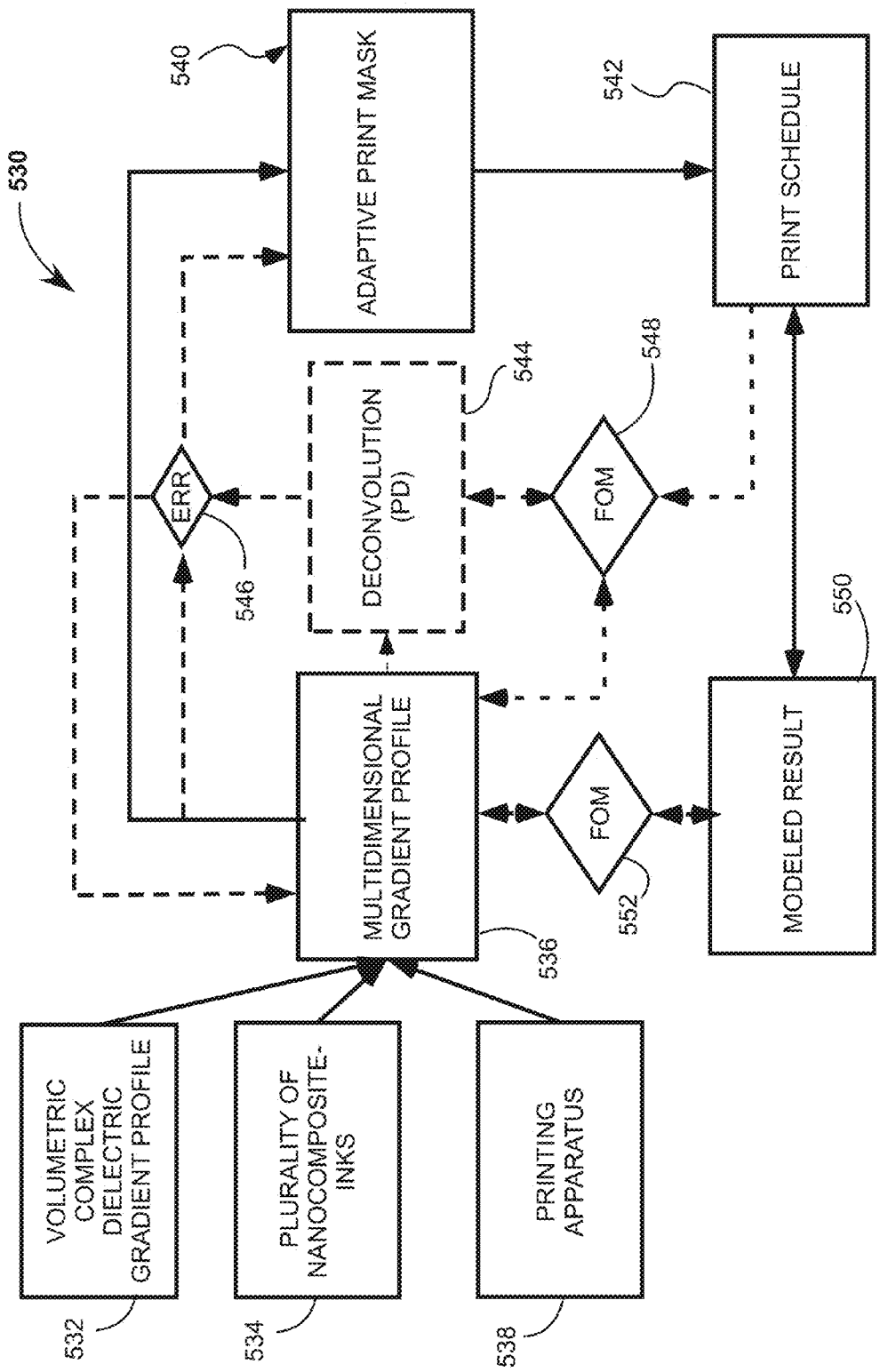
FIG. 14A is a block diagram illustrating another method of manufacturing the volumetric gradient complex dielectric device including an adaptive print mask aware of spatial frequency.

Referring to FIG. 14A, a method 530 includes providing or having a volumetric complex dielectric gradient profile 532 and a plurality of nanocomposite-inks 534 each with a finite concentration of at least one type of a nanoparticle dispersed within a curable organic-matrix. The volumetric complex dielectric gradient profile and the plurality of nanocomposite-inks are used to provide a multidimensional gradient profile 536. Multidimensional gradient profile 536 provides the nanoparticle concentration at any particular voxel, or 3-dimensional coordinate, volumetric complex dielectric gradient profile. Optionally, print parameter from a printing apparatus 538 can be used in part to determine multidimensional gradient profile 536.

In one embodiment the multidimensional gradient profile 536 is provided to an adaptive print mask 540 to determine discretized spatial position of the plurality of nanocomposite-ink droplets. Optionally, a deconvolution 544 can be applied to multidimensional gradient profile 536. Deconvolution 544 introduces the physical nanocomposite-ink diffusion effects and provides the limiting nanocomposite-ink concentration profile capable of being manufactured. The deconvolved nanocomposite-ink concentration profile can be compared to nanocomposite concentration profile 536 and an error 546 can be generated. Determination of adaptive print mask 540 can be gated based on an acceptable error value. The error can be provided as feedback informing constraints on multidimensional gradient profile 536 requiring different nanocomposite-inks 534 to be provided or other diffusion controls via printing apparatus 538. Alternatively, the deconvolved nanocomposite-ink concentration profile can be provided as a practical feedback mechanism to an optimizer to generate another volumetric complex dielectric gradient profile 532.

Adaptive print mask 540 determines the spatial discretization of nanocomposite-ink droplets via anisotropic frequency filters that determine local and optionally global frequency components of positions, print tiles, or subtiles spatially defined within the nanocomposite-ink concentration gradient profile. Adaptive print mask 540 has an adaptive threshold and can include a varying size pattern based on spatial-frequency components detected and a predetermined nanocomposite-ink calibration table. Operation of the adaptive print mask is explained in detail further hereinbelow.

After spatial discretization by adaptive print mask 540 a print schedule 542 is determined. A figure of merit can be used to compare at least one property between either the nanocomposite-ink profile or the deconvolved nanocomposite-ink profile to an expected manufactured device. An FOM 548 can be based on physical composition, performance, of combinations thereof. For instance when the non-homogenous complex dielectric device is a refractive gradient optic FOM 548 can be based on wavefront error, PSF, MTF, and other such metrics. The FOM can be weighted by functional areas within the device or a plurality of weighted FOMs.

Print schedule 542 has a deposition schedule, a cure schedule and a print path. The cure schedule can follow the print path or independently cure areas partially as described above. A modeled result 550 can be compared via a FOM 552, using any aforementioned composition or performance metrics to iteratively optimize either the deposition schedule, the cure schedule, print path, or combinations thereof in an optimization algorithm.

Figure 14B:
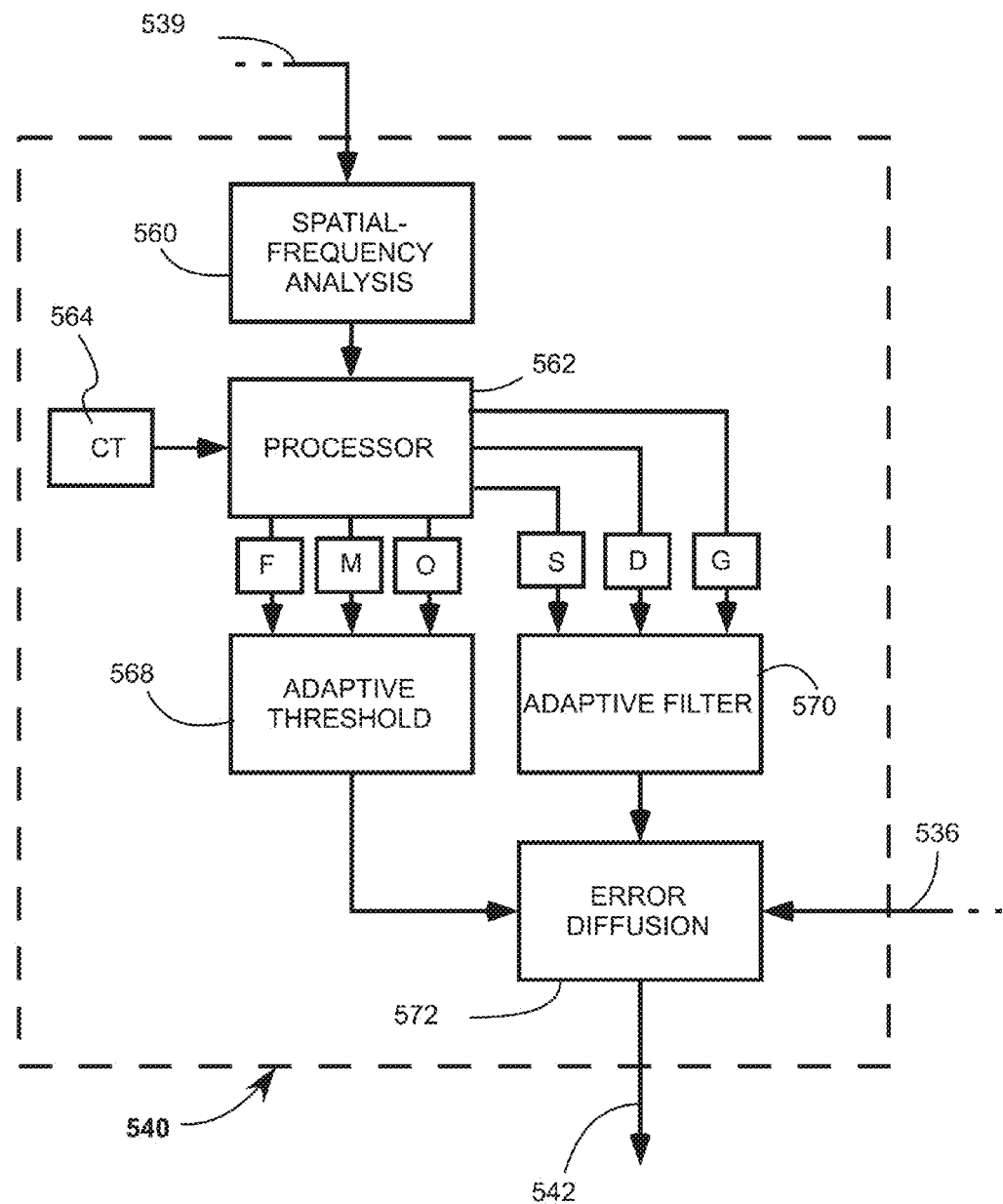
FIG. 14B is a block diagram of the adaptive print mask operation as that seen in FIG. 14B.

Referring also to FIG. 14B, adaptive print mask 540 is explained in greater detail. Input from either multidimensional gradient profile 536 or deconvolved nanocomposite-ink concentration profile 544 undergoes a spatial frequency analysis 560 through a processor 562. On a print tile by print tile basis, or droplet position by droplet position basis, spatial frequency analysis 560 is performed. The spatial frequency analysis can use an anisotropic local spatial frequency filter around the neighborhood of the print tile to determine at least a frequency component F, a concentration magnitude M, and an orientation O. The local neighborhood can be defined about the same size as expected of diffusion of the plurality of nanocomposite-inks. Optionally, a second larger local filter, or a global frequency filter can be used to determine frequency components about the nanocomposite-ink concentration gradient profile.

The filter can be applied on a layer-by-layer basis, or 3-dimensionally. The local spatial frequency filter determine local spatial frequency components in the neighborhood of the processed print tile by using an edge detection filter such as a Gabor filter, a Laplacian, a Laplacian of a Gaussian, and other such anisotropic filters. The local spatial frequency filters are applied across at least two orientations or angles preferably including at least the angle parallel with the direction of refractive-gradients. When frequency components between two angles are of similar magnitude the local spatial frequency filter is preferably applied at an intermediate angle. Analysis of the filter applied to obtain the dominant frequency component can be performed by commonly known frequency analysis techniques, for instance discrete fourier transform (DFT). Based on the local frequency, concentration magnitude, and orientation, a threshold value can be determined to effectively increase or decrease resulting error an adaptive filter 570.

A calibration table 564 provides processor 562 indexed data of various deposition patterns according to the frequency component, magnitude and optionally orientation to determine a value of an adaptive threshold 568. The calibration table can be based on calculated or premeasured print tiles and diffusion between nanocomposite-inks. Such calibration techniques are described in U.S. patent application Ser. No. 14/836,297. Intermediate values can be determined based on interpolation. Orientations not provided can be transformed appropriately.

Adaptive filter 570 includes a size S, a diffusion coefficient D, and scaling factor G based in part based on the spatial-frequency analysis 560 and diffusion of the nanocomposite-inks. For local neighborhoods with higher frequency components the size S and coefficient distribution D of adaptive filter 570 can be increased to preserve high frequency content and distribute error to other pixels. Similarly, for low frequency content or areas of constant nanoparticle concentration the adaptive filter can decrease in size. Based on adaptive threshold 568 and adaptive filter 570 an error diffusion 572 is applied to each print tile or volumetric area along an error diffusion path. For each print tile a nanocomposite-ink droplet or pattern is selected and error is quantized based on nanocomposite-ink profile 536 and adaptive threshold 568. The quantized error is distributed according to adaptive filter 570.

Another method of manufacturing a volumetric continuous gradient complex dielectric element with drop-on-demand techniques by calculating spatial placement of nanocomposite-ink droplets comprises: determining or having a multi-dimensional gradient profile representing a volumetric gradient complex dielectric element; providing or having a plurality of nanocomposite-inks, at least one of the nanocomposite-inks having a curable organic-matrix and a concentration of nanoparticles dispersed within; determining or having a one-, two-, or three-dimensional print mask that reconstructs the multi-dimensional gradient profile as a discretized pattern based on the material properties of the plurality of nanocomposite-inks and properties of a printing apparatus with a plurality of print heads; and computing a spatial or spatio-temporal print schedule based in part on the discretized pattern that results in an at least approximate reproduction of the gradient profile when printed with the printing apparatus.

Referring to FIG. 15, a printing apparatus 600 has a plurality of printheads that spatially span a lateral footprint 602L of a volumetric optical-element 602 such that the nanocomposite-inks can be deposited at each voxel during a single pass. Here, the plurality of printheads include a printhead 604A, a printhead 604B, a printhead 604C, and a printhead 604D. Here, the four printheads each span the lateral footprint 602L and are separated by a printhead spacing 606 that can be different from printhead to printhead.

Each of the plurality of printheads can be staggered by a lateral spacing 608. Each of the plurality of printheads preferably have hundreds or thousands of nozzles depositing the nanocomposite-ink. The plurality of printheads can be staggered relative to one another such that nozzles are spatially staged relative to one another. With aligned nozzles, droplets from nozzles can be deposited at a linear distance relative to one another, for instance a fraction of the droplet size. With staggered nozzles, droplets can be deposited such that droplets overlap with other droplets from another of the plurality of printheads thereby increasing lateral resolution. The plurality of nozzles can also be staggered on an order much larger than the nozzle size or droplet size to increase the lateral extent of the effective printing area to cover a larger spatial span.

Staggered printheads 620 has a printhead 622A, a printhead 622B, a printhead 622C, a printhead 622D, and a printhead 622E that at slightly overlapped. Such a configuration allows printing a larger volumetric gradient complex dielectric element. This staggered pattern can be repeated to allow more types of nanocomposite-ink deposited along a same, or staggered, traversal path.

Depositing the nanocomposite-ink in a single pass can be followed by an immediate optical curing. While the print mask can factor in turbulence and Kolmogov cell size and displacement, curing the nanocomposite-in on a time-frame that is within seconds of droplet deposition can prevent displacement due to Kolmogov cell turbulence. In some methods, the deposited nanocomposite-ink is cured to prevent displacement before the droplet kinetic energy and pressure is dissipated. In some embodiments curing is based on Kologorov's turbulence model and curing is performed with microseconds or seconds of deposition.

Figure 16:
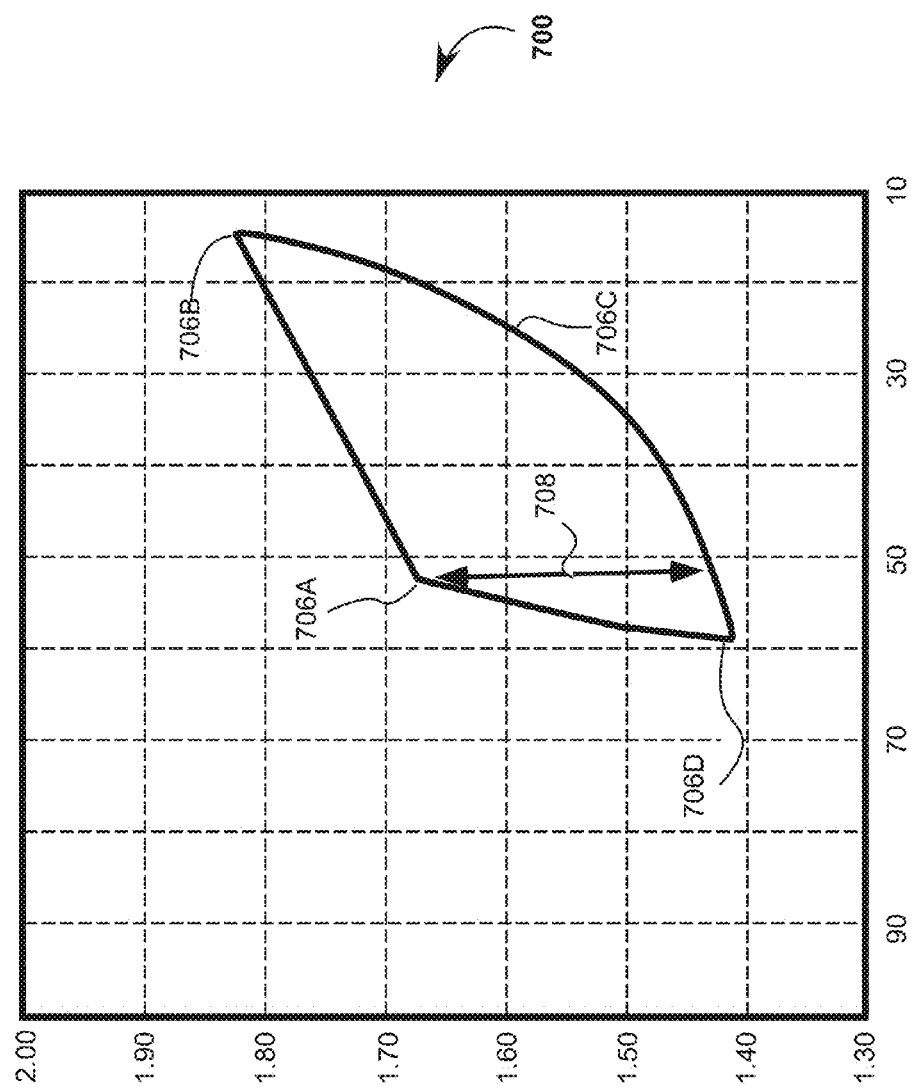
FIG. 16 is a graphical representation of an Abbe dispersion envelope covered by nanocomposite-inks formulations.

The plurality of printheads can each contain a different type of nanocomposite-ink. One or more of the plurality of nanocomposite-inks can have the same type of nanocomposite-ink, or the plurality of printheads can have a different nanocomposite-ink with different optical properties, such as optical dispersion. Referring to FIG. 16, a graph 700 shows an exemplary Abbe number dispersion envelope 702 that using various nanocomposite-ink formulations. A nanocomposite-ink formulation 706A, a nanocomposite-ink formulation 706B, a nanocomposite-ink formulation 706C, and a nanocomposite-ink formulation 706D define the envelope. Nanocomposite-ink with optical dispersion within the envelope can be realized by varying the nanoparticle type, concentration, or organic matrix material type as described above. In some embodiments, the abbe number difference between at least two of the nanocomposite-inks is 5% or more. In other embodiments, the nanocomposite-inks can be formulated along a relatively linear path of the dispersion curve, such as linear path 608, wherein the difference between the index of refraction between at least two of the nanocomposite-inks differs by more than 0.025 and the difference is abbe coefficients of the two inks is less than 5% their mean value. In yet another embodiment, the nanocomposite-inks can be formulated such between the partial dispersion coefficients of at least two of the inks differs by less than 5% their mean value and the abbe number differs by at least 5% of the mean of their value.

From the description of the present disclosure provided herein one skilled in the art can manufacture the apparatus and practice the methods disclosed in accordance with the present disclosure. While the present invention has been described in terms of particular embodiments and examples, others can be implemented without departing from the scope of the present invention. In summary, the present disclosure above describes particular embodiments. The invention, however, is not limited to the embodiments described and depicted herein. Rather, the invention is limited only by the claims appended hereto.

What is claimed is:

1. A method of manufacturing a volumetric continuous gradient complex dielectric element with drop-on-demand techniques, such as inkjet printing, by calculating spatial placement of nanocomposite-ink droplets, the method comprising:
   determining or having a multi-dimensional gradient profile representing a volumetric gradient complex dielectric element;
   providing or having a plurality of nanocomposite-inks, at least one of the nanocomposite-inks having a curable organic-matrix and a concentration of nanoparticles dispersed within;
   determining or having a one-, two-, or three-dimensional print mask that reconstructs the multi-dimensional gradient profile as a discretized pattern based on the material properties of the plurality of nanocomposite-inks and properties of a printing apparatus with a plurality of print heads, each containing multiple nozzles for ejecting inks; and
   computing a spatial or spatio-temporal print schedule based in part on the discretized pattern that results in an at least approximate reproduction of the gradient profile when printed with the printing apparatus.

2. The method of claim 1, wherein the width of at least one of the plurality of printheads spatially span one or more of the dimensions of the volumetric gradient complex dielectric element allowing deposition over the entire area of the element in a single pass.

3. The method of claim 1, wherein the two or more of the plurality of printheads are staggered spatially relative to one another, such that the deposition of the nanocomposite-ink is staggered relative to one or more of the plurality of print heads.

4. The method of claim 1, wherein the two or more printheads are staggered spatially relative to one another, such that the drops from the nozzle from one of the plurality of printheads are deposited at a linear distance that is a fraction of the drop size relative to one or more of the drops from the nozzle from one or more another of the plurality printheads.

5. The method of claim 1, wherein two or more of the plurality of printheads are placed in a linear array, such that the nozzles of the printheads traverse a translation path during printing that overlap the translation path of the nozzles of another of the plurality of printheads, deviating by no more than a droplet size.

6. The method of claim 1, wherein the drop velocity is a variable factor that determines, in part, the print mask design.

7. The method of claim 1, wherein the ink viscosity is a variable factor that determines, in part, the print mask design.

8. The method of claim 1, wherein the Kolmogorov cell properties are factored into the print mask design.

9. The method of claim 1, wherein optical radiation curing is used after a single pass of the plurality of printheads.

10. The method of claim 1, wherein at least one of the plurality of printheads contain a nanocomposite-ink different than one or more of the plurality of printheads.

11. The method of claim 10, wherein the difference between the index of refraction between at least two of the nanocomposite-inks is at least 0.025.

12. The method of claim 10, wherein the abbe number difference between at least two of the nanocomposite-inks is 5% or more.

13. The method of claim 10, wherein the difference between the index of refraction between at least two of the nanocomposite-inks differs by more than 0.025 and the difference is abbe coefficients of the two inks is less than 5% their mean value.

14. The method of claim 10, wherein the difference between the partial dispersion coefficients of at least two of the nanocomposite-inks differs by more than 5% their mean value.

15. The method of claim 10, wherein the difference between the partial dispersion coefficients of at least two of the inks differs by less than 5% their mean value and the abbe number differs by at least 5% of the mean of their value.

16. The method of claim 1, wherein the plurality of printheads are staggered relative to one another.

17. The method of claim 1, wherein the spatio-temporal print schedule includes optical curing that is scheduled before the kinetic energy of deposited droplets is dissipated.

18. The method of claim 1, wherein two or more of the plurality of print heads has a material that does not include nanoparticles.

19. The method of claim 1, wherein the spatio-temporal print schedule is completed by one pass of the print heads over the complex dielectric element.

20. The method of claim 19, wherein optical curing is performed to prevent displacement due to Kolmogorov cell turbulence.

21. The method of claim 1, wherein the spatio-temporal print schedule is completed by two or more passes of the print heads over the complex dielectric element.

22. The method of claim 1, wherein the spatio-temporal print schedule includes deposition of a soluble optical ink.

23. The method of claim 1, wherein the spatio-temporal print schedule includes deposition of at least one optical ink that has optical radiation spectral curing properties different than at least one other element.

24. The method of claim 1, wherein the spatio-temporal print schedule includes deposition of at least one optical ink that is not cured by optical radiation.

\* \* \* \* \*